(12) United States Patent
Fujimoto et al.

(10) Patent No.: US 8,853,711 B2
(45) Date of Patent: Oct. 7, 2014

(54) SEMICONDUCTOR LIGHT EMITTING DEVICE AND METHOD FOR MANUFACTURING SAME

(75) Inventors: Akira Fujimoto, Kanagawa-ken (JP); Koji Asakawa, Kanagawa-ken (JP); Ryota Kitagawa, Tokyo (JP); Takanobu Kamakura, Kanagawa-ken (JP); Shinji Nunotani, Tokyo (JP); Eishi Tsutsumi, Kanagawa-ken (JP); Masaaki Ogawa, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 393 days.

(21) Appl. No.: 13/037,937

(22) Filed: Mar. 1, 2011

(65) Prior Publication Data

US 2012/0056232 A1 Mar. 8, 2012

(30) Foreign Application Priority Data

Sep. 6, 2010 (JP) ................................. 2010-199417

(51) Int. Cl.
*H01L 33/00* (2010.01)
*H01L 33/38* (2010.01)
*B82Y 20/00* (2011.01)
*H01L 33/42* (2010.01)

(52) U.S. Cl.
CPC ......... *H01L 33/38* (2013.01); *H01L 2933/0016* (2013.01); *H01L 33/42* (2013.01); *B82Y 20/00* (2013.01)
USPC ............. 257/79; 257/102; 257/130; 257/613; 257/615; 257/81; 257/99

(58) Field of Classification Search
USPC ................ 257/79, 102, 130, 613, 615, 81, 99
See application file for complete search history.

(56) References Cited

U.S. PATENT DOCUMENTS 6,903,374 B2 * 6/2005 Katayama ........................ 257/79
2009/0242925 A1 * 10/2009 Kitagawa et al. ............... 257/99

FOREIGN PATENT DOCUMENTS

JP 2009-76361 4/2009

OTHER PUBLICATIONS

U.S. Appl. No. 13/221,319, filed Aug. 30, 2011, Masunaga, et al.
U.S. Appl. No. 13/037,914, filed Mar. 1, 2011, Kitagawa et al.
U.S. Appl. No. 13/038,154, filed Mar. 1, 2011, Masunaga et al.
U.S. Appl. No. 13/037,864, filed Mar. 1, 2011, Kitagawa et al.
U.S. Appl. No. 13/037,990, filed Mar. 1, 2011, Asakawa et al.
U.S. Appl. No. 12/712,693, filed Feb. 25, 2010, Fujimoto et al.
U.S. Appl. No. 12/876,318.

(Continued)

*Primary Examiner* — Zandra Smith
*Assistant Examiner* — Tsz Chiu
(74) *Attorney, Agent, or Firm* — Oblon, Spivak, McClelland, Maier & Neustadt, L.L.P.

(57) ABSTRACT

A semiconductor light emitting device includes a structural body, a first electrode layer, an intermediate layer and a second electrode layer. The structural body includes a first semiconductor layer of first conductivity type, a second semiconductor layer of second conductivity type, and a light emitting layer between the first and second semiconductor layers. The first electrode layer is on a side of the second semiconductor layer opposite to the first semiconductor layer; the first electrode layer includes a metal portion and plural opening portions piercing the metal portion along a direction from the first semiconductor layer toward the second semiconductor layer, having an equivalent circular diameter not less than 10 nanometers and not more than 5 micrometers. The intermediate layer is between the first and second semiconductor layers in ohmic contact with the second semiconductor layer. The second electrode layer is electrically connected to the first semiconductor layer.

17 Claims, 8 Drawing Sheets

(56) References Cited

OTHER PUBLICATIONS

InGaN-Based Near-Ultravoilet and Blue-Light-Emitting Diodes with High External Quantum Efficiency Using a Patterned Sapphire Substrate and a Mesh Electrode. Motokazu Yamada, et al., Jpn. J. Appl. Phys. vol. 41 (2002) pp. L 1431-L 1433, Part 2, No. 12B, Dec. 15, 2002.

* cited by examiner

SEMICONDUCTOR LIGHT EMITTING DEVICE AND METHOD FOR MANUFACTURING SAME

CROSS-REFERENCE TO RELATED APPLICATION

This application is based upon and claims the benefit of priority from the prior Japanese Patent Application No. 2010-199417, filed on Sep. 6, 2010; the entire contents of which are incorporated herein by reference.

FIELD

Embodiments described herein relate generally to a semiconductor light emitting device and a method for manufacturing the same.

BACKGROUND

A semiconductor light emitting device includes an electrode in ohmic contact with the surface of a semiconductor layer. The semiconductor light emitting device emits light by providing current to the electrode. Therefore, it is desirable for light emitting devices of illumination apparatuses and the like to be relatively large. Therefore, semiconductor light emitting devices have been considered in which fine line electrodes extend from the pad electrode along the semiconductor layer surface. Also, semiconductor light emitting devices have been considered in which a metal electrode is provided on the entire surface of the light-emitting surface and nanometer (nm)-order ultra-fine openings are made in the metal electrode. However, even higher luminance is necessary in semiconductor light emitting devices.

DETAILED DESCRIPTION

Figure 1:
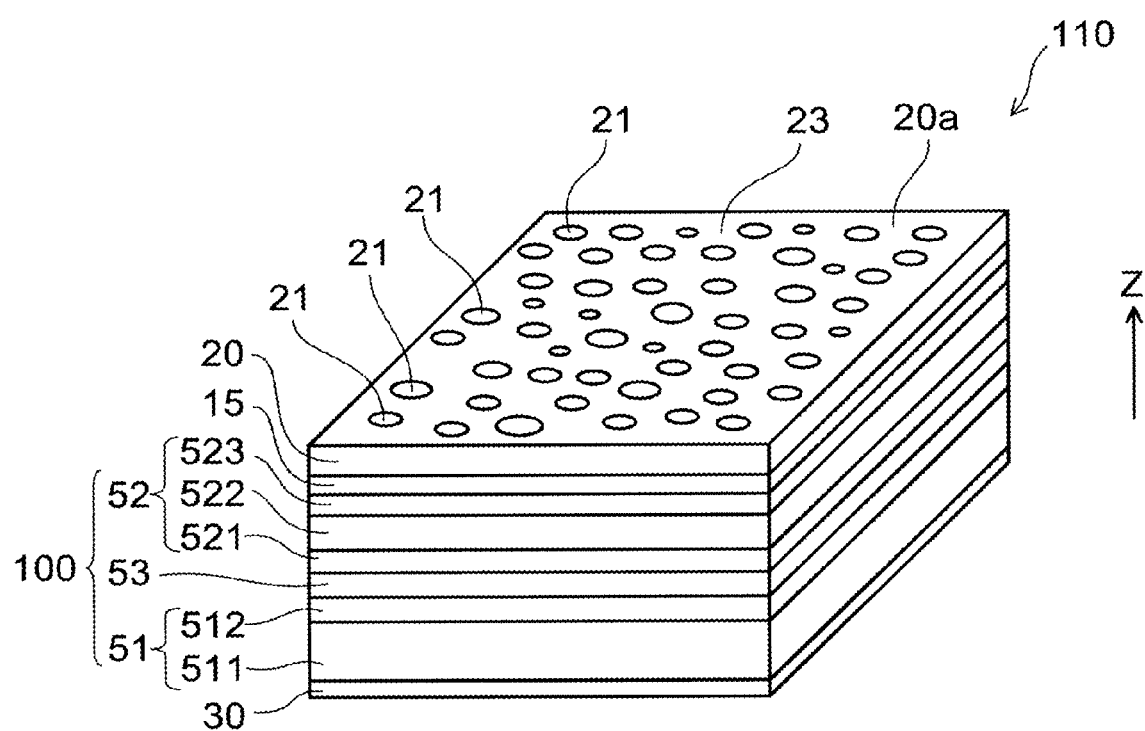
FIG. 1 is a schematic perspective view illustrating a semiconductor light emitting device.

In general, according to one embodiment, a semiconductor light emitting device includes a structural body, a first electrode layer, an intermediate layer and a second electrode layer. The structural body includes a first semiconductor layer of a first conductivity type, a second semiconductor layer of a second conductivity type, and a light emitting layer provided between the first semiconductor layer and the second semiconductor layer. The first electrode layer is provided on a side of the second semiconductor layer opposite to the first semiconductor layer; the first electrode layer includes a metal portion and a plurality of opening portions piercing the metal portion along a direction from the first semiconductor layer toward the second semiconductor layer. An equivalent circular diameter of each of the opening portions is not less than 10 nanometers and not more than 5 micrometers. The intermediate layer is provided between the second semiconductor layer and the first electrode layer in ohmic contact with the second semiconductor layer. The second electrode layer is electrically connected to the first semiconductor layer.

Embodiments of the invention will now be described based on the drawings.

The drawings are schematic or conceptual; and the relationships between the thicknesses and widths of portions, the proportional coefficients of sizes among portions, etc., are not necessarily the same as the actual values thereof. Further, the dimensions and the proportional coefficients may be illustrated differently among the drawings, even for identical portions.

In the specification and the drawings of the application, components similar to those described in regard to a drawing thereinabove are marked with like reference numerals, and a detailed description is omitted as appropriate.

Hereinbelow, specific examples are described as examples in which the first conductivity type is the n-type and the second conductivity type is the p-type.

First Embodiment

FIG. 1 is a schematic perspective view illustrating the configuration of a semiconductor light emitting device according to an embodiment.

The semiconductor light emitting device 110 according to the first embodiment includes a structural body 100, an intermediate layer 15, a first electrode layer 20, and a second electrode layer 30.

The structural body 100 includes a first semiconductor layer 51 of the first conductivity type, a second semiconductor layer 52 of the second conductivity type, and a light emitting layer 53 provided between the first semiconductor layer 51 and the second semiconductor layer 52.

The first semiconductor layer 51 includes, for example, a clad layer 512 of n-type InAlP. The clad layer 512 is formed on, for example, a substrate 511 of n-type GaAs. For convenience in the embodiment, the substrate 511 is taken to be included in the first semiconductor layer 51.

The second semiconductor layer 52 includes, for example, a clad layer 521 of p-type InAlP. A current diffusion layer 522 of p-type InGaAlP, for example, is provided on the clad layer 521; and a contact layer 523 is provided thereon. For convenience in the embodiment, the current diffusion layer 522 and the contact layer 523 are taken to be included in the second semiconductor layer 52.

The light emitting layer 53 is provided between the first semiconductor layer 51 and the second semiconductor layer 52. In the semiconductor light emitting device 110, for example, a heterostructure is formed of the clad layer 512 of the first semiconductor layer 51, the light emitting layer 53, and the clad layer 521 of the second semiconductor layer 52.

The first electrode layer 20 is provided on the side of the second semiconductor layer 52 opposite to the first semiconductor layer 51.

For convenience of description in the embodiment, the second semiconductor layer 52 side of the structural body 100 is taken as the front face side or the upper side; and the first semiconductor layer 51 side of the structural body 100 is taken as the back face side or the lower side. The stacking direction from the first semiconductor layer 51 toward the second semiconductor layer 52 is labeled as the Z direction.

The first electrode layer 20 includes a metal portion 23 and multiple opening portions 21 piercing the metal portion 23 along the Z direction. The equivalent circular diameter of each of the multiple opening portions 21 is not less than 10 nm and not more than 5 μm.

Herein, the equivalent circular diameter is defined by the following formula (1).

$$\text{Equivalent circular diameter} = 2 \times (\text{surface area}/\pi)^{1/2} \quad (1)$$

Herein, the "surface area" is the surface area of the opening portions as viewed from the Z direction.

The opening portions 21 are not necessarily limited to being circular. Accordingly, in the embodiments, the opening portion 21 is designated using the definition of the equivalent circular diameter recited above.

The intermediate layer 15 is provided between the second semiconductor layer 52 and the first electrode layer 20. The intermediate layer 15 is provided between at least the metal portion 23 of the first electrode layer 20 and the second semiconductor layer 52.

In the case that the intermediate layer 15 is provided on the entire surface of the second semiconductor layer 52, the intermediate layer 15 is transmissive (optically transmissive) to the light emitted from the light emitting layer 53. Thereby, the light emitted from the light emitting layer 53 passes through the intermediate layer 15 to be emitted from the first electrode layer 20 to the outside.

In the case that the intermediate layer 15 is optically transmissive, it is desirable for the transmission with respect to the light emitted from the light emitting layer 53 to be not less than 90%.

Further, the intermediate layer 15 is electrically conductive and thermally conductive. In other words, the intermediate layer 15 has an ohmic contact with the second semiconductor layer 52.

Such an intermediate layer 15 may include, for example, a metal oxide film. The intermediate layer 15 is not limited to a metal oxide film and is not limited as long as a material which is optically transmissive, electrically conductive, and thermally conductive as necessary is used.

The second electrode layer 30 is electrically connected to the first semiconductor layer 51. In this example, the second electrode layer 30 is provided on the back face side of the structural body 100. The second electrode layer 30 may include, for example, Au.

In such a semiconductor light emitting device 110, the surface on which the first electrode layer 20 is formed is utilized as the main light emitting surface. In other words, light having a prescribed center wavelength is emitted from the light emitting layer 53 by applying a prescribed voltage between the first electrode layer 20 and the second electrode layer 30. The light is emitted mainly from a major surface 20a of the first electrode layer 20 to the outside.

Because the intermediate layer 15 is provided between the first electrode layer 20 and the second semiconductor layer 52 in the semiconductor light emitting device 110 according to the embodiment, the second semiconductor layer 52 does not directly contact the first electrode layer 20. Accordingly, a light absorption layer that occurs in the contact interface of the second semiconductor layer 52 in the case of direct contact does not form; and the emission efficiency of the light produced by the light emitting layer 53 to the outside can be increased.

One specific example of the semiconductor light emitting device 110 will now be described.

The semiconductor light emitting device 110 includes, for example, the n-type GaAs substrate 511; and a heterostructure which includes, for example, the n-type InAlP clad layer 512, the InGaP light emitting layer 53, and the p-type InAlP clad layer 521, is formed on the substrate 511.

The light emitting layer 53 may have a MQW (Multiple Quantum Well) configuration in which, for example, a barrier layer and a well layer are repeatedly provided alternately. The light emitting layer 53 may include a SQW (Single Quantum Well) configuration including one set of a well layer interposed between barrier layers.

Then, the current diffusion layer 522 of, for example, p-type InGaAlP is formed on the light emitting layer 53. Such semiconductor layer configurations are examples; and the embodiment is not limited thereto.

The contact layer 523 of, for example, GaP is formed on the current diffusion layer 522; and the intermediate layer 15 is formed thereon with the contact layer 523 interposed therebetween. The contact layer 523 is utilized to provide sufficient ohmic contact between the intermediate layer 15 and the second semiconductor layer 52. In particular, in the case that the current diffusion layer 522 is formed of multiple elements, e.g., is a layer made of three or more elements such as, for example, InGaAlP and AlGaAs, good ohmic contact between the intermediate layer 15 and the current diffusion layer 522 is obtained by providing such a contact layer 523.

Here, the contact layer 523 may include, for example, GaP. However, the embodiment is not limited thereto. The material of the contact layer 523 may be selected appropriately based on the material of the first electrode layer 20 and the material of the current diffusion layer 522 adjacent to the contact layer 523.

To obtain an ohmic contact between the second semiconductor layer 52 and the intermediate layer 15, the carrier concentration of the second semiconductor layer 52 is set to be somewhat high. For example, in the case that the intermediate layer 15 is a metal oxide film and the second semiconductor layer 52 is a compound semiconductor, it is favorable for the carrier concentration of the second semiconductor layer 52 at the interface proximity between the intermediate layer 15 and the second semiconductor layer 52 to be not less than about $1 \times 10^{19}$ cm$^{-3}$. Thereby, an ohmic contact can be provided between the intermediate layer 15 and the second semiconductor layer 52.

The intermediate layer 15 may include, for example, a metal oxide film. The metal oxide film may include one selected from ITO, $SnO_2$, ZnO, CdO, $TiO_2$, NiO, $Ga_2O_3$, InGaZnO, $CuAlO_2$, $CuGaO_2$, $CuInO_2$, LaCuOS, LaCuOSe, and $SrCu_2O_2$.

By using such a material, the intermediate layer 15 can be appropriately optically transmissive, electrically conductive, and thermally conductive.

The first electrode layer 20 may include, for example, Au/Au—Zn as a p-side electrode. The multiple opening portions 21 are provided in the first electrode layer 20 to pierce the metal portion 23 in the Z direction. The size and the disposition of each of the opening portions 21 may be regular or irregular.

The n-side second electrode layer 30 made of, for example, Au is formed on the back face side of the substrate which is the first semiconductor layer 51. The second electrode layer 30 is electrically connected to the first semiconductor layer 51.

In the semiconductor light emitting device 110 according to the embodiment, the light produced by the light emitting layer 53 is emitted to the outside from the entire surface of the second semiconductor layer 52 which is the current diffusion layer on which the first electrode layer 20 is provided.

Such a semiconductor light emitting device 110 may be used in various apparatuses. Recently, the use of the semiconductor light emitting device 110 in image display apparatuses and illumination apparatuses is being studied. In such a semiconductor light emitting device 110, basically, electrodes are provided on both faces of the semiconductor layer; and light is emitted by current flowing between the electrodes.

In a general semiconductor light emitting device, because current is provided to a pad electrode provided in a portion of the surface of the semiconductor layer, light is emitted from the periphery of the pad electrode.

To increase the light emitting region of the semiconductor light emitting device, contrivances have been made, for example, to increase the surface area of the light emitting portion by adding fine line electrodes extending from the electrode of the pad portion along the semiconductor layer surface. However, increasing the number of the fine line electrodes makes the electrode structure complex.

On the other hand, the characteristic of the luminance with respect to the current of the semiconductor light emitting device has a peak at a certain current value; and the luminance decreases when more current flows.

One reason that the luminance decreases is that heat is generated by a large current flowing in the interior of the semiconductor light emitting device and heat dissipation is insufficient. Therefore, sufficient cooling (heat dissipation) of the semiconductor light emitting device is performed to realize a semiconductor light emitting device having high luminance.

In the semiconductor light emitting device 110 according to the embodiment, the first electrode layer 20 includes the multiple nm-scale opening portions 21 piercing the metal portion 23. Because the first electrode layer 20 including such opening portions 21 includes a metal, the electrical conductivity is higher than that of an oxide transparent electrode such as a semiconductor or ITO (Indium Tin Oxide) of a general current diffusion layer by a factor of 10 to 100; and the thermal conductivity also is high. Therefore, the forward voltage (Vf) when the semiconductor light emitting device 110 is assembled is lower than that of the case where ITO is used. As a result, current concentration in the light emitting layer 53 is mitigated; more uniform light emission is provided; and the luminance increases.

Here, generally, the ohmic contact between the metal and the semiconductor is realized by performing heat treatment. However, in the case that the ohmic contact is provided by heat treatment, a light absorption layer forms with a thickness of about 100 nm in the semiconductor contacting the metal. The light absorption layer absorbs the light produced by the light emitting layer 53, which causes the luminance to decrease.

Therefore, in the semiconductor light emitting device 110 according to the embodiment, the intermediate layer 15 is provided between the second semiconductor layer 52 and the first electrode layer 20 such that the second semiconductor layer 52 does not directly contact the first electrode layer 20. Thereby, the absorption layer that would form due to direct contact between the metal and the semiconductor does not form; and the emission efficiency of the light produced by the light emitting layer 53 to the outside can be increased.

In the semiconductor light emitting device 110 according to the embodiment, the first electrode layer 20 is the light emitting surface. Accordingly, a condition to efficiently emit the light from the light emitting layer 53 to the outside is (1) the equivalent circular diameter of the opening portions 21 of the first electrode layer 20 being not less than 10 nm and not more than 5 μm. A more favorable condition is (2) the thickness of the intermediate layer 15 being not less than 10 nm and not more than 200 nm. An even more favorable condition is (3) the thickness of the first electrode layer 20 being not less than 10 nm and not more than 200 nm.

The reason for condition (1) recited above is as follows.

Namely, in the semiconductor light emitting device 110, high heat dissipation is obtained by providing a relatively large first electrode layer 20 to suppress the temperature increase of the semiconductor light emitting device 110. The temperature increase of the semiconductor light emitting device 110 is suppressed also by adjusting the size (e.g., the equivalent circular diameter) of the opening portions 21 provided in the first electrode layer 20. In other words, the series resistance can be reduced by reducing the forward voltage of the semiconductor light emitting device 110 to reduce the heat generation itself.

To realize such effects, it is favorable to be able to provide current uniformly from the first electrode layer 20 including the opening portions 21 to the entire surface of the second semiconductor layer 52. The size and center spacing of each of the multiple opening portions 21 are limited somewhat to provide the current uniformly to the second semiconductor layer 52.

Although depending also on the doping concentration and the like of the semiconductor layer in which the current flows, the range in which the current flows obtained by calculations of simulations, etc., is a range up to about 5 μm from the edge of the first electrode layer 20. In other words, in the case that the diameter of the opening portion is about 5 μm or more, a range in which the current does not flow may occur; the series resistance cannot be reduced sufficiently; and the forward voltage cannot be reduced sufficiently. Therefore, the upper limit of the average opening portion diameter of the opening portions 21 is not more than 5 μm and more favorably not more than 1 μm.

In order for the optical transmission (the transmission of the light produced by the light emitting layer 53 to the outside) of the first electrode layer 20 to provide effects greater than those of the opening ratio (the ratio of the surface area of the opening portions to the surface area of the first electrode layer 20), it is desirable for the equivalent circular diameter to be not more than about ½ of the center wavelength of the light produced by the light emitting layer 53. For example, in the case of visible light, it is favorable for the equivalent circular diameter of the opening portions 21 to be not more than 300 nm.

On the other hand, there are no constraints on the lower limit of the equivalent circular diameter of the opening portions 21 from the viewpoint of the resistance value. For ease of manufacturing, it is favorable for the equivalent circular diameter of the opening portions 21 to be not less than 10 nm and more favorable to be not less than 30 nm.

The reason for condition (2) recited above is as follows.

Namely, the ability to transmit the light produced by the light emitting layer 53 increases as the film thickness of the intermediate layer 15 decreases. However, it is conceivable that being too thin may cause the film to be discontinuous or the electrical conductivity to decrease. Accordingly, the lower limit of the film thickness of the intermediate layer 15 is about 10 nm.

On the other hand, the electrical conductivity increases as the film thickness of the intermediate layer 15 increases. However, it is conceivable that being too thick may increase the difficulty of manufacturing by reducing the adhesion with the second semiconductor layer 52, etc. Accordingly, the upper limit of the film thickness of the intermediate layer 15 is about 200 nm and more favorably about 50 nm.

The reason for condition (3) recited above is as follows.

Namely, the metal used as the material of the first electrode layer 20 is not limited as long as the metal has sufficient electrical conductivity and thermal conductivity; and any metal generally usable as an electrode may be used. It is favorable to use Ag and Au as a base metal from the viewpoint of absorption loss. From the viewpoint of ensuring the adhesion and the heat resistance, it is favorable to include at least one material selected from Al, Zn, Zr, Si, Ge, Pt, Rh, Ni, Pd, Cu, Sn, C, Mg, Cr, Te, Se, and Ti or an alloy thereof.

The metal portion 23 (the portion where the opening portions 21 are not provided) of the first electrode layer 20 is continuous without a break between any two points from at least a current supply source such as the pad electrode. This is to ensure the electrical conductivity and maintain a low resistance value.

In the case that multiple current supply sources are provided, it is sufficient for the metal portion 23 of the first electrode layer 20 to be continuous for each of the current supply sources.

It is also desirable for the metal portion 23 to be continuous to emit light uniformly from the light emitting surface of the semiconductor light emitting device 110. Thus, from the viewpoint of the resistance value of the first electrode layer 20, it is favorable for the sheet resistance of the first electrode layer 20 to be not more than 10Ω/□ and more favorable to be not more than 5Ω/□. The heat generation of the semiconductor light emitting device 110 decreases as the sheet resistance decreases. Also, uniform light emission and an increase of the luminance become pronounced.

From the viewpoint of the sheet resistance recited above, the thickness of the first electrode layer 20 is not less than 10 nm. On the other hand, the resistance value decreases as the thickness of the first electrode layer 20 increases. From the viewpoint of ensuring the transmission of the light produced by the light emitting layer 53, it is favorable for the upper limit of the thickness of the first electrode layer 20 to be not more than 50 nm.

Here, the bulk reflectance of the first electrode layer 20 is not less than 70%. Thereby, the light produced by the light emitting layer 53 passes through the first electrode layer 20.

As in the semiconductor light emitting device 110 according to the embodiment, it is possible to increase the emission efficiency of the light produced by the light emitting layer 53 and increase the luminance of the emitted light from the first electrode layer 20 by satisfying condition (1) recited above, more favorably by satisfying condition (2) recited above, and even more favorably by satisfying condition (3) recited above.

Now disclosed is a method for manufacturing a semiconductor light emitting device.

The method for manufacturing the semiconductor light emitting device includes, for example, methods (A) to (C) recited below.

(A) Method Using Self-Assembly of Block Copolymer

One method for manufacturing the semiconductor light emitting device utilizes phase separation using the self-assembly block copolymer. Such a method includes the following processes.

Namely, this manufacturing method includes: a process (a1) of forming an intermediate layer on a structural body including a first semiconductor layer of the first conductivity type, a second semiconductor layer of the second conductivity type, and a light emitting layer provided between the first semiconductor layer and the second semiconductor layer, where the intermediate layer is formed on the second semiconductor layer; a process (a2) of forming a metal layer on the intermediate layer; a process (a3) of creating a microdomain pattern by coating a composition including a block copolymer onto at least a portion of a surface of the metal layer and performing phase separation of the block copolymer; and a process (a4) of forming a first electrode layer including multiple opening portions by etching the metal layer using the microdomain pattern as a mask, where an equivalent circular diameter of the multiple opening portions is not less than 10 nm and not more than 5 micrometers.

Then, the equivalent circular diameter of each of the multiple opening portions is not less than 10 nm and not more than 5 μm in the process (a4) of forming the first electrode layer.

Specifically, for example, the semiconductor light emitting device can be obtained as follows.

FIGS. 2A to 2F are schematic cross-sectional views illustrating process examples of the method using the self-assembly block copolymer.

Figure 2A:
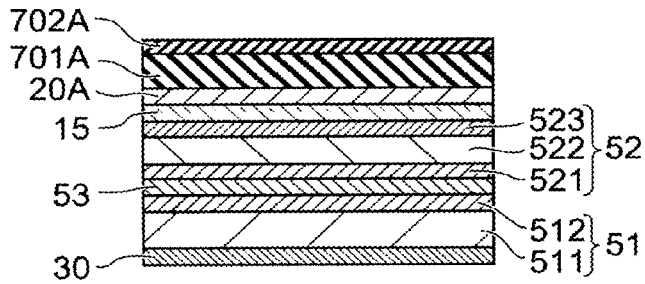
FIGS. 2A to 2F, 3A to 3G, 4A to 4F, 5A to 5G, 6A to 6D, 7A to 7D, and 8A to 8H are schematic cross-sectional views illustrating methods for manufacturing the semiconductor light emitting device.

First, as illustrated in FIG. 2A, the light emitting layer 53 is formed on the first semiconductor layer 51; and the second semiconductor layer 52 is formed thereon. The second electrode layer 30 is formed on the first semiconductor layer 51.

Then, the contact layer 523 is formed on the second semiconductor layer 52; and the intermediate layer 15 is formed thereon. A metal layer 20A is formed on the intermediate layer 15.

Continuing, a resist 701A layer is formed on the metal layer 20A. A SOG (Spin On Glass) layer 702A is formed on the resist 701A.

Figure 2E:
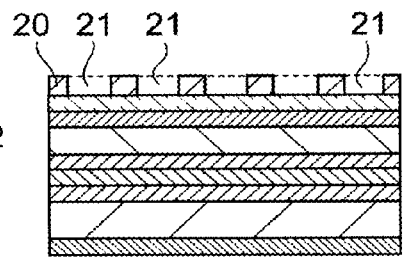
Figure 2B:
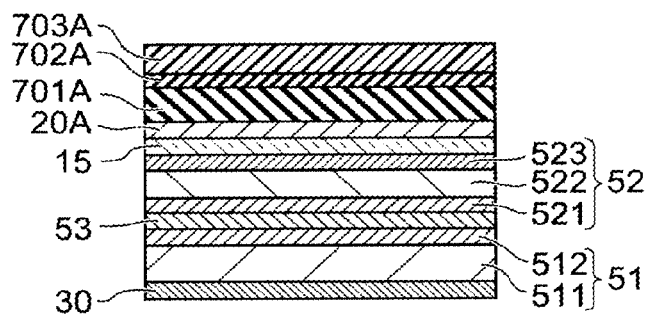

Then, as illustrated in FIG. 2B, a liquid in which a block copolymer including blocks of two types of polymers is dissolved in a solvent is coated onto the SOG layer 702A using spin coating. Subsequently, the solvent is removed by prebaking to form a block copolymer film 703A. Then, as illustrated in FIG. 2C, the film is annealed to perform phase separation of the two types of polymers to form a dot pattern 703 of one type of polymer.

Continuing, the dot pattern 703 is etched using an RIE (Reactive Ion Etching) apparatus. Due to the etching rate difference between the two types of polymers at this time, a hole pattern of the polymer having the faster etching rate is made.

Figure 2F:
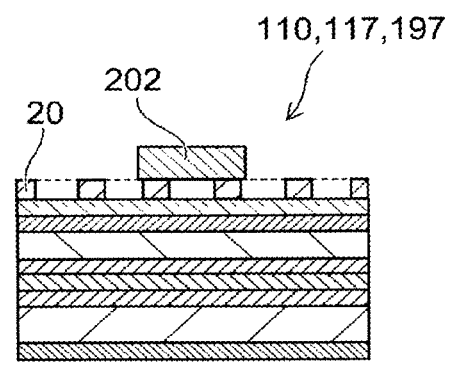
Figure 2C:
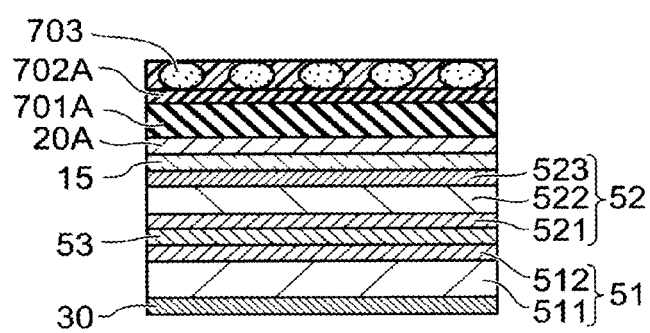
Figure 2D:
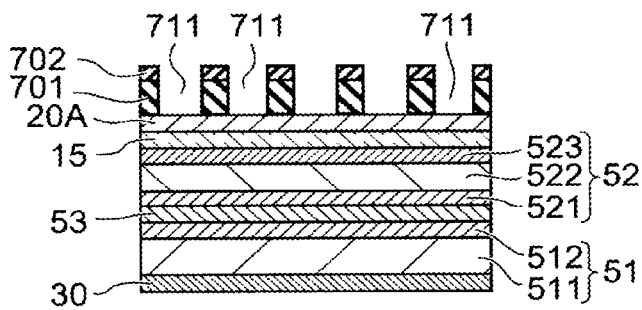

Then, as illustrated in FIG. 2D, a SOG hole pattern 702 is formed by etching the SOG layer 702A using the hole pattern of the polymer as a mask by using, for example, an RIE apparatus. Then, a resist hole mask 701 is formed using the SOG hole pattern 702 as a mask by using an RIE apparatus. Resist opening portions 711 are provided in the resist hole mask 701.

Continuing, as illustrated in FIG. 2E, ion milling is performed using the SOG hole pattern 702 and the resist hole mask 701 as a mask to etch the metal layer 20A. Thereby, the metal layer 20A corresponding to the resist opening portions 711 is etched to make the opening portions 21 in the metal layer 20A. The metal layer 20A having the opening portions 21 made therein becomes the first electrode layer 20. After etching the metal layer 20A, the SOG hole pattern 702 and the resist hole mask 701 are removed.

Finally, as illustrated in FIG. 2F, a pad electrode 202 is formed; and the semiconductor light emitting device 110 is completed.

FIGS. 3A to 3G are schematic cross-sectional views illustrating process examples of another method using the self-assembly block copolymer.

Figure 3A:
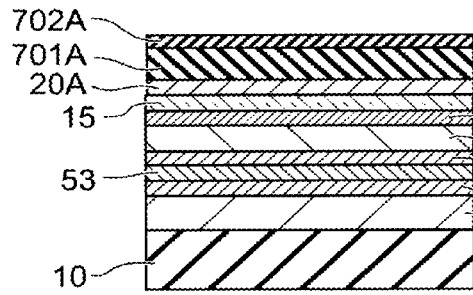

First, as illustrated in FIG. 3A, the first semiconductor layer 51 is formed on the growth substrate 10; the light emitting layer 53 is formed thereon; and the second semiconductor layer 52 is formed thereon. The first semiconductor layer 51, the light emitting layer 53, and the second semiconductor layer 52 are formed on the growth substrate 10 using, for example, epitaxial growth.

Then, the intermediate layer 15 is formed on the second semiconductor layer 52; and the metal layer 20A is formed on the intermediate layer 15.

Continuing, the resist 701A layer is formed on the metal layer 20A. The SOG (Spin On Glass) layer 702A is formed on the resist 701A.

Figure 3E:
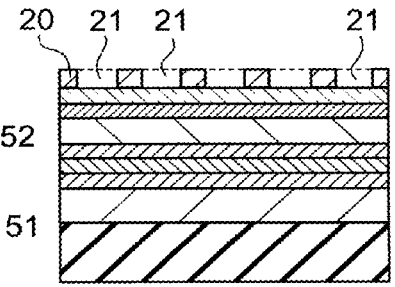
Figure 3B:
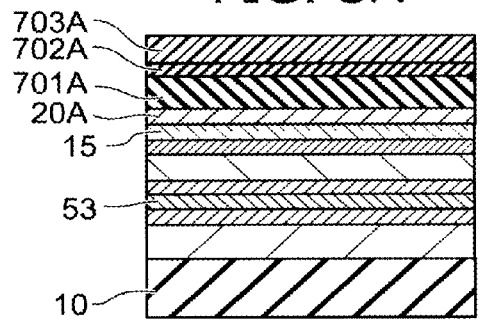

Then, as illustrated in FIG. 3B, a liquid in which a block copolymer including blocks of two types of polymers is dissolved in a solvent is coated onto the SOG layer 702A using spin coating. Subsequently, the solvent is removed by pre-baking to form the block copolymer film 703A. Then, as illustrated in FIG. 3C, the film is annealed to perform phase separation of the two types of polymers to form the dot pattern 703 of one type of polymer.

Continuing, the phase-separated block copolymer is etched. At this time, the dot pattern 703 of the one type of polymer is selectively etched due to the etching rate difference between the two types of polymers; and a hole pattern is made from the other type of polymer.

Figure 3F:
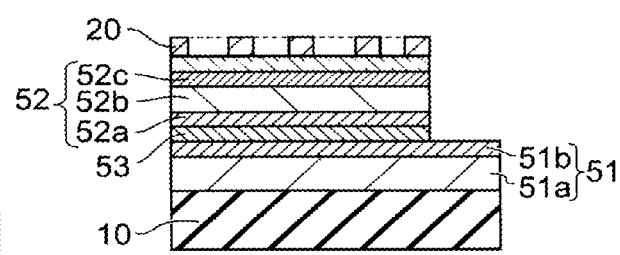
Figure 3C:
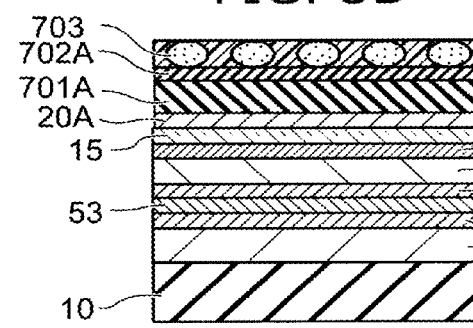
Figure 3G:
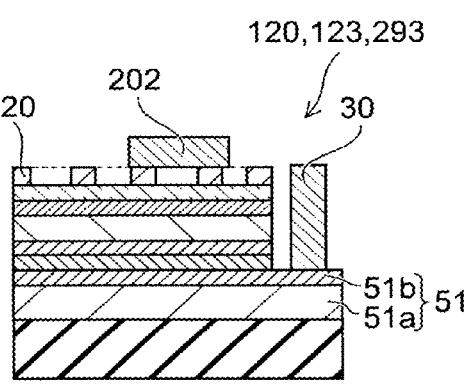
Figure 3D:
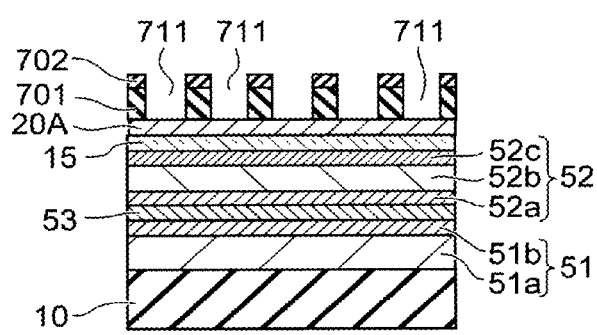

Then, as illustrated in FIG. 3D, the SOG hole pattern 702 is formed by etching the SOG layer 702A using the hole pattern of the polymer as a mask by using, for example, an RIE apparatus. Then, the resist hole mask 701 is formed using the SOG hole pattern 702 as a mask by using an RIE apparatus. The resist opening portions 711 are provided in the resist hole mask 701.

Continuing, as illustrated in FIG. 3E, the metal layer 20A is etched by performing ion milling using the SOG hole pattern 702 and the resist hole mask 701 as a mask. Thereby, the opening portions 21 are made in the metal layer 20A. The metal layer 20A having the opening portions 21 made therein becomes the first electrode layer 20. After etching the metal layer 20A, the SOG hole pattern 702 and the resist hole mask 701 are removed.

Then, as illustrated in FIG. 3F, a portion of the first electrode layer 20, the intermediate layer 15, the second semiconductor layer 52, and the light emitting layer 53 is etched to expose the first semiconductor layer 51.

Finally, as illustrated in FIG. 3G, the pad electrode 202 is formed on the first electrode layer 20; the second electrode layer 30 is formed on the exposed portion of the first semiconductor layer 51; and a semiconductor light emitting device 120 is completed.

(B) Method Utilizing Stamper

Yet another method for manufacturing the semiconductor light emitting device utilizes a stamper. Such a method includes the following processes.

Namely, this manufacturing method includes: a process (b1) of forming a light emitting layer on a first semiconductor layer of the first conductivity type and forming a second semiconductor layer of the second conductivity type on the light emitting layer; a process (b2) of forming an intermediate layer on the second semiconductor layer; a process (b3) of forming a metal layer on the intermediate layer; a process (b4) of forming a resist on the metal layer; a process (b5) of using a stamper including multiple protruding portions to make multiple resist recessed portions corresponding to the multiple protruding portions in the resist; a process (b6) of forming a first electrode layer including multiple opening portions in the metal layer by etching the metal layer using the resist in which the multiple resist recessed portions are made as a mask; and a process (b7) of forming a second electrode layer electrically connected to the first semiconductor layer.

In the process (b2) of forming the intermediate layer, the thickness of the intermediate layer is formed to be not less than 10 nm and not more than 200 nm. In the process (b6) of forming the first electrode layer, the equivalent circular diameter of each of the multiple opening portions is not less than 10 nm and not more than 5 μm.

Specifically, for example, the semiconductor light emitting device can be obtained as follows.

FIGS. 4A to 4F are schematic cross-sectional views illustrating process examples of the method utilizing the stamper.

Figure 4A:
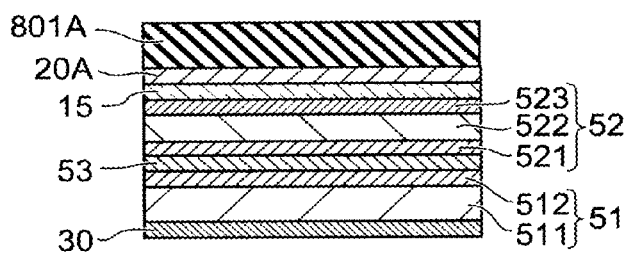

First, as illustrated in FIG. 4A, the light emitting layer 53 is formed on the first semiconductor layer 51; and the second semiconductor layer 52 is formed thereon. The second electrode layer 30 is formed on the first semiconductor layer 51.

Then, the contact layer 523 is formed on the second semiconductor layer 52; and the intermediate layer 15 is formed thereon. The metal layer 20A is formed on the intermediate layer 15. Then, a resist 801A layer is formed on the metal layer 20A.

Figure 4E:
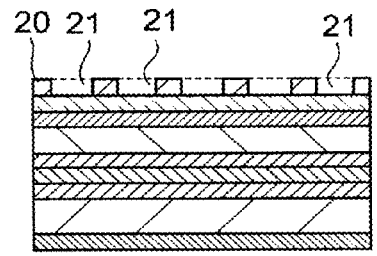
Figure 4B:
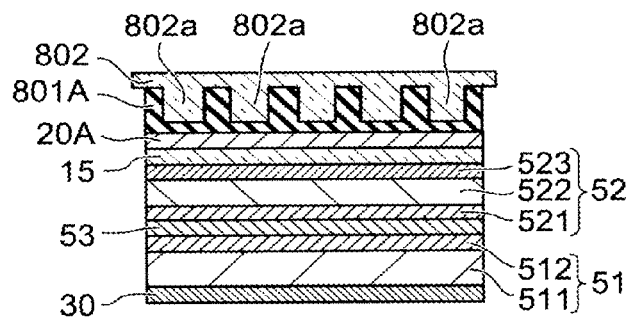

Continuing as illustrated in FIG. 4B, a stamper 802 including a protruding portion 802a is prepared. For example, a plurality of the protruding portions 802a are provided on the transfer surface of the stamper 802 where the protruding portions 802a are provided; and the multiple protruding portions 802a are discontinuous.

The stamper 802 may be manufactured by forming the desired structure, for example, on quartz using electron beam lithography. Further, the material of the stamper 802 and the ultra-fine unevenness structure formation method of the stamper 802 are not limited. For example, it is possible to form the stamper 802 by the methods using the self-assembly block copolymer or the fine particle mask described above.

Then, as illustrated in FIG. 4B, imprinting is performed in which the side of the stamper 802 having the protruding configuration is pressed onto the resist 801A in a state in which the resist 801A is heated to a prescribed temperature as necessary. After the imprinting, the resist 801A is cured by cooling to room temperature; and the stamper 802 is released. Thereby, as illustrated in FIG. 4C, a resist pattern 801B including recessed portions corresponding to the protruding portions 802a is formed.

Figure 4F:
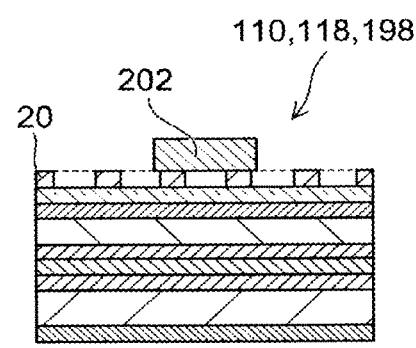
Figure 4C:
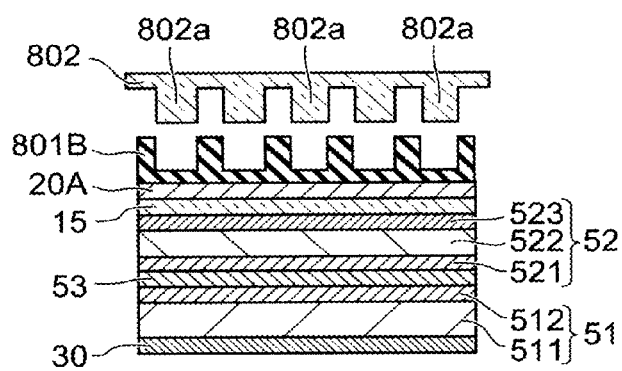
Figure 4D:
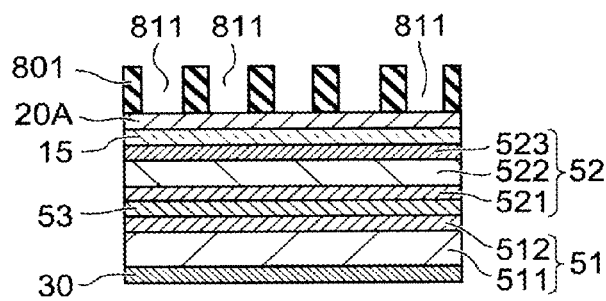

Continuing as illustrated in FIG. 4D, the resist pattern 801B is etched. Thereby, the bottoms of the recessed portions of the resist layer are removed to expose the metal layer 20A. The portions where the metal layer 20A is exposed are resist opening portions 811.

Then, the metal layer 20A is etched by performing ion milling using the resist 801 in which the resist opening portions 811 are made as a mask. Thereby, as illustrated in FIG. 4E, the opening portions 21 corresponding to the resist opening portions 811 are made in the metal layer 20A. The metal layer 20A having the opening portions 21 made therein becomes the first electrode layer 20. After etching the metal layer 20A, the resist pattern 801B is removed.

Finally, as illustrated in FIG. 4F, the pad electrode 202 is formed; and the semiconductor light emitting device 110 is completed.

The method utilizing the stamper is not limited to forming using heat such as that recited above. Various technology may be used such as forming by curing a resist using light irradiation, forming using a flexible stamper such as PDMA (poly (dimethylacrylamide)), etc.

FIGS. 5A to 5G are schematic cross-sectional views illustrating process examples of another method utilizing the stamper.

Figure 5A:
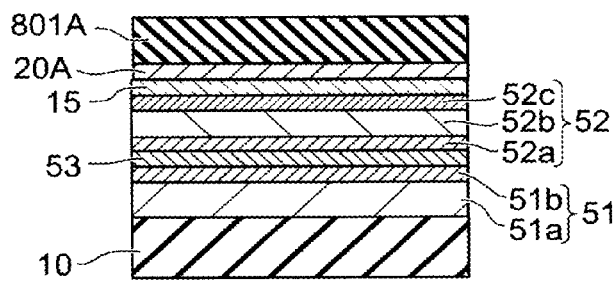

First, as illustrated in FIG. 5A, the first semiconductor layer 51 is formed on the growth substrate 10; the light emitting layer 53 is formed thereon; and the second semiconductor layer 52 is formed thereon. The first semiconductor layer 51, the light emitting layer 53, and the second semiconductor layer 52 are formed on the growth substrate 10 using, for example, epitaxial growth.

Then, the intermediate layer 15 is formed on the second semiconductor layer 52; and the metal layer 20A is formed on the intermediate layer 15. Then, the resist 801A layer is formed on the metal layer 20A.

Figure 5E:
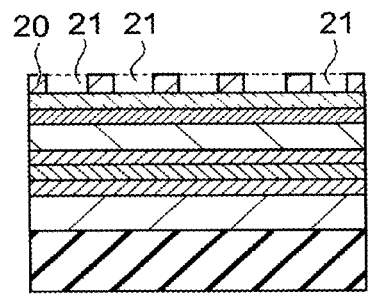
Figure 5B:
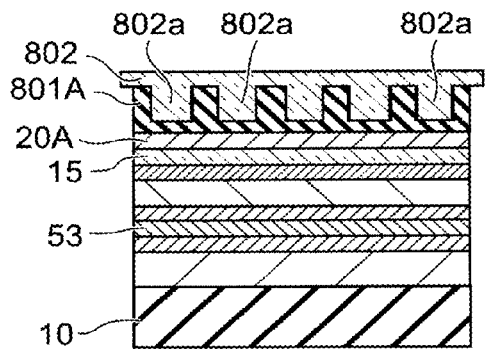

Continuing as illustrated in FIG. 5B, the stamper 802 including the protruding portions 802a is prepared. Then, as illustrated in FIG. 5B, imprinting is performed by pressing the side of the stamper 802 having the protruding configuration onto the resist 801A in a state in which the resist 801A is heated to a prescribed temperature as necessary. After the imprinting, the resist 801A is cured by cooling to room temperature; and the stamper 802 is released. Thereby, as illustrated in FIG. 5C, the resist pattern 801B including recessed portions corresponding to the protruding portions 802a is formed.

Figure 5F:
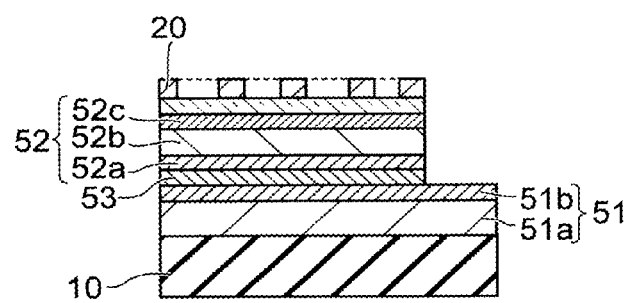
Figure 5C:
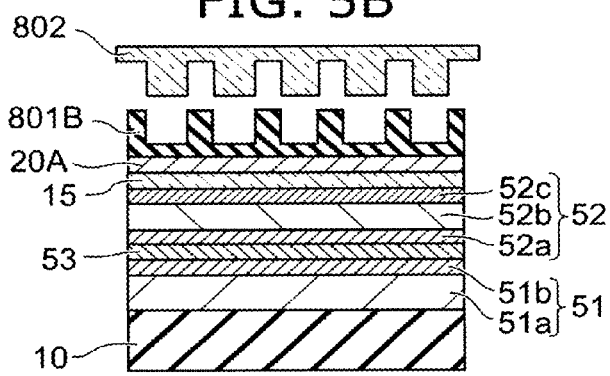
Figure 5G:
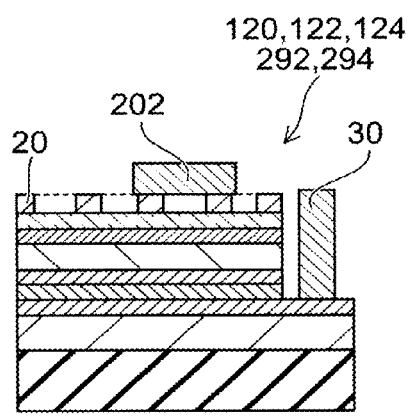
Figure 5D:
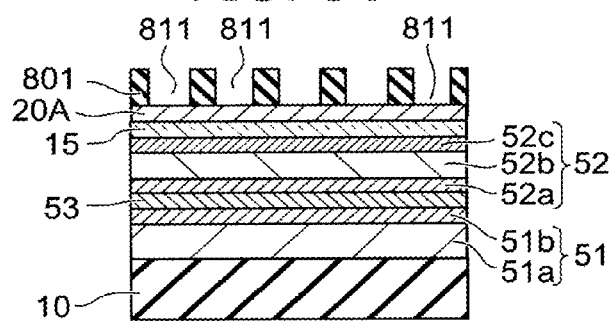

Then, as illustrated in FIG. 5D, the resist pattern 801B is etched. Thereby, the bottoms of the recessed portions of the resist layer are removed to expose the metal layer 20A. The portions where the metal layer 20A is exposed are the resist opening portions 811.

Continuing, as illustrated in FIG. 5E, the metal layer 20A is etched by performing ion milling using the resist 801 in which the resist opening portions 811 are made as a mask. Thereby, the opening portions 21 corresponding to the resist opening portions 811 are made in the metal layer 20A. The metal layer 20A having the opening portions 21 made therein becomes the first electrode layer 20. After etching the metal layer 20A, the resist pattern 801B is removed.

Then, as illustrated in FIG. 5F, a portion of the first electrode layer 20, the intermediate layer 15, the second semiconductor layer 52, and the light emitting layer 53 is etched to expose the first semiconductor layer 51.

Finally, as illustrated in FIG. 5G, the pad electrode 202 is formed on the first electrode layer 20; the second electrode layer 30 is formed on the exposed portion of the first semiconductor layer 51; and the semiconductor light emitting device 120 is completed.

(C) Method Utilizing Electron-Beam Lithography

Another method for manufacturing the semiconductor light emitting device is a method using electron-beam lithography. The method for manufacturing the semiconductor light emitting device utilizing such a method includes the following processes.

Namely, this manufacturing method includes: a process (c1) of forming a light emitting layer on a first semiconductor layer of the first conductivity type and forming a second semiconductor layer of the second conductivity type on the light emitting layer; a process (c2) of forming an intermediate layer on the second semiconductor layer; a process (c3) of forming a metal layer on the intermediate layer; a process (c4) of forming a resist on the metal layer; a process (c5) of making the multiple first resist opening portions and multiple second resist opening portions in the resist by irradiating an electron beam and developing; a process (c6) of forming a first electrode layer including multiple opening portions in the metal layer by etching the metal layer using the resist in which the multiple resist opening portions are made as a mask; and a process (c7) of forming a second electrode layer electrically connected to the first semiconductor layer.

Then, in the process (c2) of forming the intermediate layer, the thickness of the intermediate layer is formed to be not less than 10 nm and not more than 200 nm. In the process (c6) of forming the first electrode layer, the equivalent circular diameter of each of the multiple first opening portions is not less than 10 nm and not more than 5 μm.

Specifically, for example, the semiconductor light emitting device is manufactured as follows.

FIGS. 6A to 6D are schematic cross-sectional views illustrating process examples of the method utilizing electron-beam lithography.

Figure 6A:
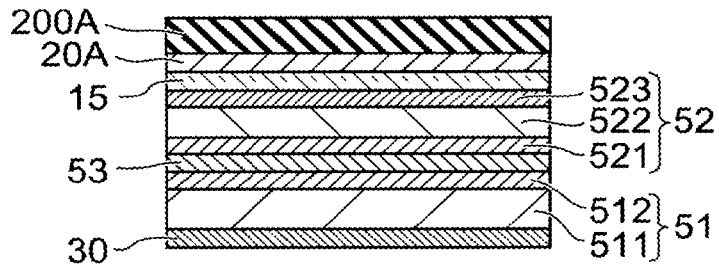

First, as illustrated in FIG. 6A, the light emitting layer 53 is formed on the first semiconductor layer 51; and the second semiconductor layer 52 is formed thereon. The second electrode layer 30 is formed on the first semiconductor layer 51.

Then, the contact layer 523 is formed on the second semiconductor layer 52; and the intermediate layer 15 is formed thereon. The metal layer 20A is formed on the intermediate layer 15. Then, an electron beam resist 200A layer is formed on the metal layer 20A.

Figure 6B:
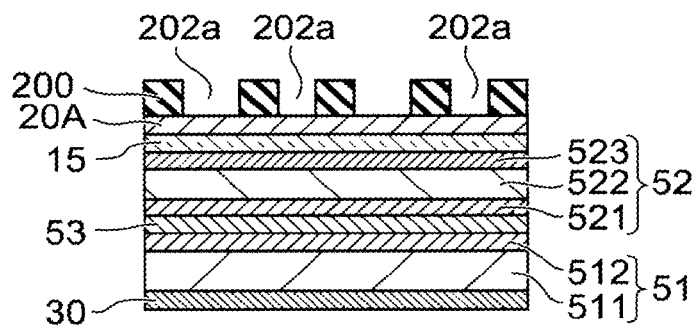

Continuing as illustrated in FIG. 6B, an electron beam lithography apparatus including a pattern generator makes first resist opening portions 202a corresponding to the opening portions 21.

Figure 6C:
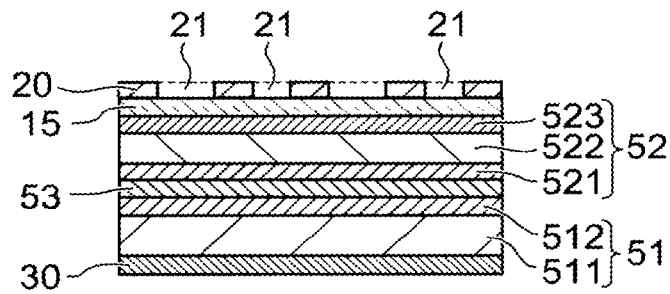

Then, as illustrated in FIG. 6C, the metal layer 20A is etched by performing ion milling using a resist pattern 200 in which the resist opening portions 202a are made as a mask. Thereby, the opening portions 21 corresponding to the resist opening portions 202a are made in the metal layer 20A. The metal layer 20A having the opening portions 21 made therein becomes the first electrode layer 20. After etching the metal layer 20A, the resist pattern 200 is removed.

Figure 6D:
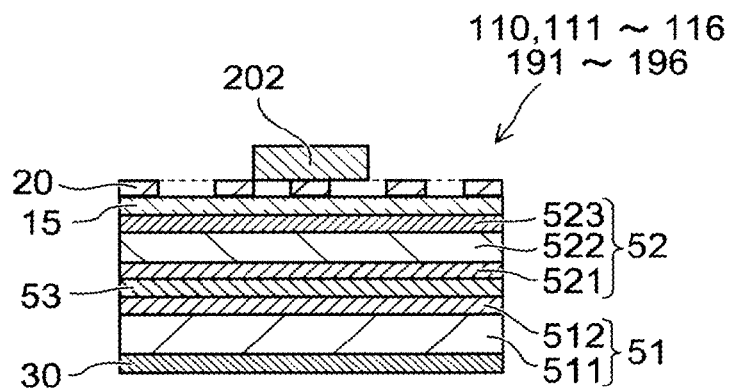

Finally, as illustrated in FIG. 6D, the pad electrode 202 is formed; and the semiconductor light emitting device 110 is completed.

FIGS. 7A to 7E are schematic cross-sectional views illustrating process examples of another method utilizing electron-beam lithography.

Figure 7A:
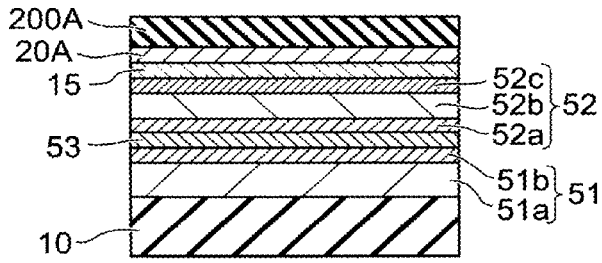

First, as illustrated in FIG. 7A, the first semiconductor layer 51 is formed on the growth substrate 10; the light emitting layer 53 is formed thereon; and the second semiconductor layer 52 is formed thereon. The first semiconductor layer 51, the light emitting layer 53, and the second semiconductor layer 52 are formed on the growth substrate 10 using, for example, epitaxial growth. Then, the intermediate layer 15 is formed on the second semiconductor layer 52; and the metal layer 20A is formed on the intermediate layer 15. Then, an electron beam resist layer is formed on the metal layer 20A.

Figure 7E:
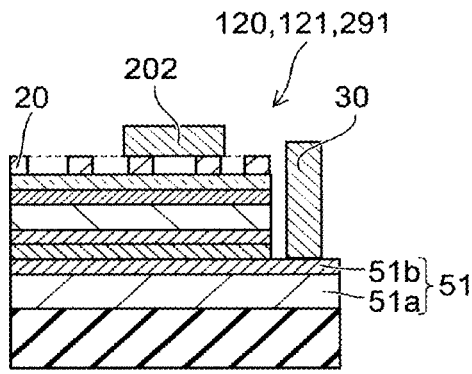
Figure 7B:
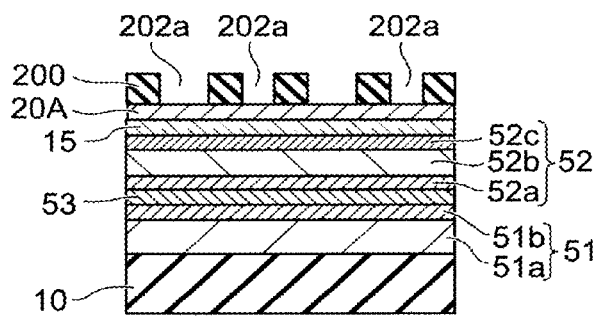

Continuing as illustrated in FIG. 7B, the resist opening portions 202a corresponding to the opening portions 21 are made using an electron beam lithography apparatus including a pattern generator.

Figure 7C:
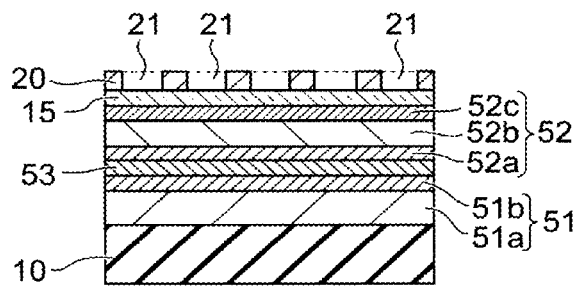

Then, as illustrated in FIG. 7C, the metal layer 20A is etched by performing ion milling using the resist pattern 200 in which the resist opening portions 202a are made as a mask. Thereby, the opening portions 21 corresponding to the resist opening portions 202a are made in the metal layer 20A. The metal layer 20A having the opening portions 21 made therein becomes the first electrode layer 20. After etching the metal layer 20A, the resist pattern 200 is removed.

Figure 7D:
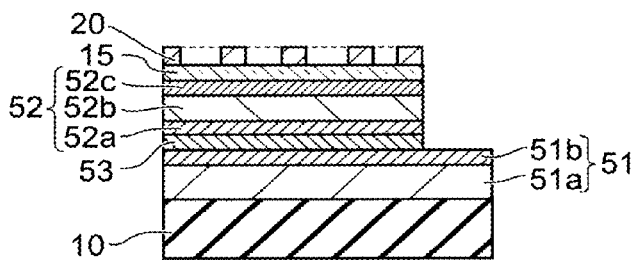

Continuing as illustrated in FIG. 7D, a portion of the first electrode layer 20, the intermediate layer 15, the second semiconductor layer 52, and the light emitting layer 53 is etched to expose the first semiconductor layer 51.

Finally, as illustrated in FIG. 7E, the pad electrode 202 is formed on the first electrode layer 20; the second electrode layer 30 is formed on the exposed portion of the first semiconductor layer 51; and the semiconductor light emitting device 120 is completed.

(D) Method Utilizing Fine Particle Mask

Yet another method for manufacturing the semiconductor light emitting device utilizes a single particle layer of fine particles such as silica as a mask. Such a method includes the following processes.

Namely, this method includes: a process (d1) of forming a light emitting layer on a first semiconductor layer of the first conductivity type and forming a second semiconductor layer of the second conductivity type on the light emitting layer; a process (d2) of forming an intermediate layer on the second semiconductor layer; a process (d3) of forming a metal layer on the intermediate layer; a process (d4) of forming a resist on the metal layer; a process (d5) of forming the single particle layer of fine particles on a surface of the resist; a process (d6) of forming a resist pattern by etching the resist using the single particle layer as an etching mask; a process (d7) of forming a reversed pattern mask by filling an inorganic substance into the opening portions of the resist pattern; a process (d8) of forming a first electrode layer including multiple opening portions by etching the metal layer using the reversed pattern mask as an etching mask; and a process (d9) of forming a second electrode layer electrically connected to the first semiconductor layer.

Then, in the process (d2) of forming the intermediate layer, the thickness of the intermediate layer is formed to be not less than 10 nm and not more than 200 nm. In the process (d8) of forming the first electrode layer, the equivalent circular diameter of each of the multiple first opening portions is not less than 10 nm and not more than 5 μm.

Specifically, for example, the semiconductor light emitting device can be obtained as follows.

FIGS. 8A to 8H are schematic cross-sectional views illustrating process examples of the method utilizing a fine particle mask.

Figure 8A:
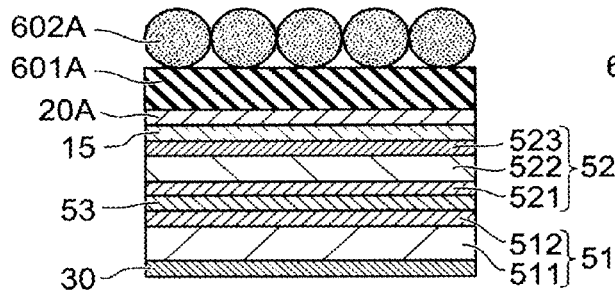

First, as illustrated in FIG. 8A, the light emitting layer 53 is formed on the first semiconductor layer 51; and the second semiconductor layer 52 is formed thereon. The second electrode layer 30 is formed on the first semiconductor layer 51.

Then, the contact layer 523 is formed on the second semiconductor layer 52; and the intermediate layer 15 is formed thereon. The metal layer 20A is formed on the intermediate layer 15. Then, a resist 601A layer is formed on the metal layer 20A.

Continuing, a dispersion solution is made by adding a monomer to a liquid in which fine particles are dispersed in, for example, ethyl lactate. The dispersion solution is dropped onto the resist 601A recited above and spin coated. After the spin coating, the solvent is removed and annealing is performed. Thereby, a single particle layer of regularly arranged fine particles 602A is formed.

Figure 8E:
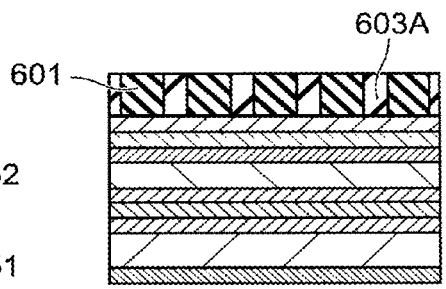
Figure 8B:
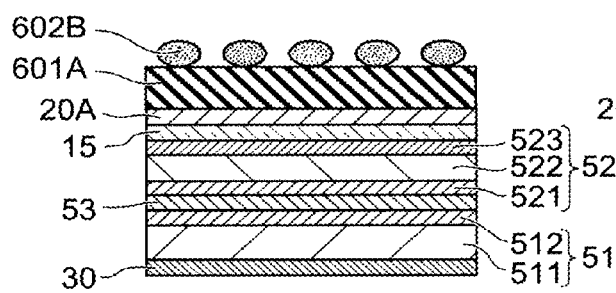

Then, as illustrated in FIG. 8B, the particle size of the fine particles is reduced by etching the layer of the arranged fine particles 602A by using an RIE apparatus. A gap occurs between reduced fine particles 602B.

Figure 8F:
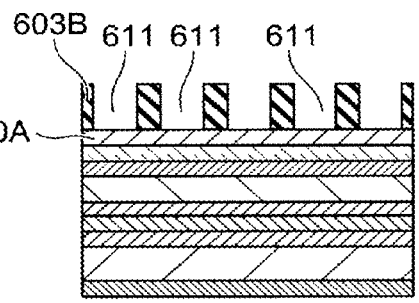
Figure 8C:
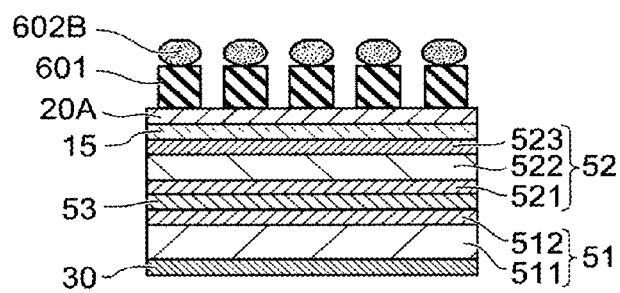

Continuing as illustrated in FIG. 8C, a resist pillar pattern 601 is formed by etching the resist 601A using the layer of the fine particles 602B as a mask.

Figure 8G:
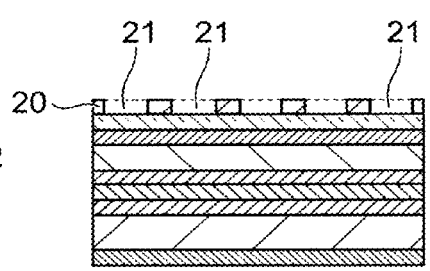
Figure 8D:
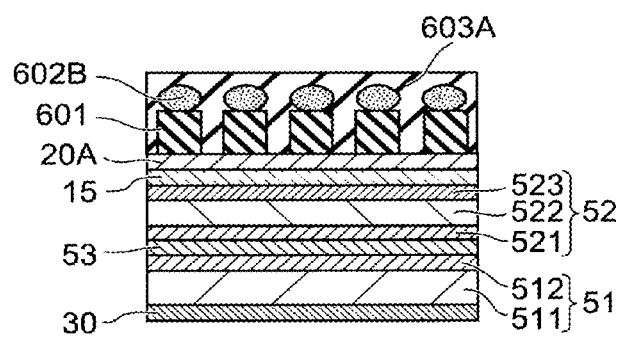

Then, as illustrated in FIG. 8D, an organic SOG composition, for example, is dropped onto the resist pillar pattern 601 and spin coated. After the spin coating, the solvent is completely removed and annealing is performed. After curing the organic SOG composition, the resist pillar pattern 601 is in a state of being buried in a SOG layer 603A. The surface of the SOG layer 603A is planarized.

Continuing as illustrated in FIG. 8E, etch-back of the SOG layer 603A is performed to expose the resist pillar pattern 601. Then, the resist pillar pattern 601 is completely removed by etching. After removing the resist pillar pattern 601, a hole pattern 603B of the SOG is formed as illustrated in FIG. 8F. The openings of the hole pattern 603B are an opening pattern 611 corresponding to the opening portions 21.

Then, as illustrated in FIG. 8G, the metal layer 20A is etched by performing ion milling using the hole pattern 603B of the SOG as a mask. Thereby, the opening portions 21 corresponding to the opening pattern 611 are made in the metal layer 20A. The metal layer 20A having the opening portions 21 made therein becomes the first electrode layer 20. After etching the metal layer 20A, the hole pattern 603B of the SOG is removed.

Figure 8H:
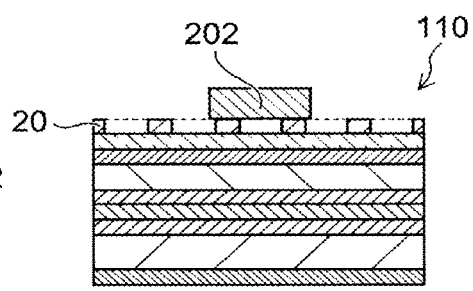

Finally, as illustrated in FIG. 8H, the pad electrode 202 is formed; and the semiconductor light emitting device 110 is completed.

Each of the manufacturing methods of (A) to (D) recited above is an example; and the methods are not limited thereto.

When etching the metal layer 20A in the methods for manufacturing recited above, the same etching mask may be used also to etch the intermediate layer 15 to make through-holes or recessed portions at positions of the intermediate layer 15 corresponding to the opening portions 21.

Examples will now be described. The materials, numbers, manufacturing conditions, etc., illustrated in the examples recited below are examples; and the invention is not limited thereto.

FIRST EXAMPLE AND COMPARATIVE EXAMPLE

In a first example, a semiconductor light emitting device 111 was manufactured by the processes illustrated in FIGS. 6A to 6D according to the method utilizing electron-beam lithography of (C) recited above.

First, a heterostructure including the n-type InAlP clad layer 512, the InGaP light emitting layer 53, the p-type InAlP clad layer 521, and the like was formed on the n-type GaAs substrate 511. The current diffusion layer 522 including the four elements of p-type InGaAlP was epitaxially grown thereon.

Then, ITO was formed as the intermediate layer 15 with a thickness of 50 nm on the p-type GaP contact layer 523 using sputtering. Subsequently, the metal layer 20A made of, for example, Au—Zn (3%) (40 nm) was formed on the intermediate layer 15 using vapor deposition. The n-side opposing electrode which is the second electrode layer 30 was formed on the back face side of the substrate 511. The light emission wavelength of the semiconductor light emitting device was 635 nm.

Continuing, an electron beam resist 200A (made by Fujifilm Corporation, product name: FEP-301) layer was formed with a thickness of 300 nm on the metal layer 20A. Then, the resist opening portions 202a were made in the electron beam resist 200A with an opening diameter of 100 nm and a spacing of 200 nm using an electron beam lithography apparatus including a pattern generator and having an acceleration voltage of 50 kV. Thereby, the resist pattern 200 including the resist opening portions 202a was formed.

Then, opening portions were made by etching the metal layer 20A for 90 seconds using an ion milling apparatus with the conditions of an acceleration voltage of 500 volts (V) and an ion current of 40 milliamperes (mA). Thereby, the first electrode layer 20 including the opening portions 21 was formed. After etching the metal layer 20A, oxygen ashing was performed to remove the resist pattern 200. Finally, the pad electrode 202 was formed; and the semiconductor light emitting device 111 was completed.

As a comparative example, a semiconductor light emitting device 191 (a first comparative example) was manufactured in which the processes were similar to those of the first example except that the first electrode layer 20 including the opening portions was formed directly on the contact layer 523 without the ITO which is the intermediate layer 15 being formed. Specifically, the process of forming the metal layer included forming a metal film made of Au (10 nm)/Au—Zn (3%) (30 nm) on the contact layer 523 using vapor deposition. Subsequently, annealing was performed at 450° C. for 30 minutes in a nitrogen atmosphere to provide a sufficient ohmic contact with the contact layer 523. The subsequent processes were performed using methods similar to the processes recited above.

Each of the semiconductor light emitting devices 111 and 191 were diced into 300 μm squares. The characteristics of the semiconductor light emitting devices 111 and 191 were compared in the bare chip state.

When comparing the forward voltage value in the case of a current value of 50 mA for each of the semiconductor light emitting devices 111 and 191, the forward voltages of the semiconductor light emitting devices 111 and 191 were the same.

When comparing the luminance in the case of a current value of 30 mA for each of the semiconductor light emitting devices 111 and 191, the luminance of the semiconductor light emitting device 111 according to the first example was higher than that of the semiconductor light emitting device 191 according to the first comparative example by a factor of 1.2.

This result illustrates that the luminance can be increased by the amount that the light absorption layer does not form in the second semiconductor layer 52 (the current diffusion layer) below the first electrode layer 20.

SECOND EXAMPLE AND COMPARATIVE EXAMPLE

In a second example, a semiconductor light emitting device 112 was diced into 1 mm square chips using processes similar to those of the first example.

In a second comparative example as well, a semiconductor light emitting device 192 was diced into 1 mm square chips using processes similar to those of the first comparative example.

The characteristics of each of the semiconductor light emitting devices 112 and 192 were compared in the bare chip state.

When comparing the forward voltage value in the case of a current value of 1 A for each of the semiconductor light emitting devices 112 and 192, the forward voltages of the semiconductor light emitting devices 112 and 192 were the same.

When comparing the luminance in the case of a current value of 500 mA for each of the semiconductor light emitting devices 111 and 191, the luminance of the semiconductor light emitting device 112 according to the second example was higher than that of the semiconductor light emitting device 192 according to the second comparative example by a factor of 1.3.

This result illustrates that the luminance can be increased by the amount that the light absorption layer does not form in the second semiconductor layer 52 (the current diffusion layer) below the first electrode layer 20 even for a semiconductor light emitting device having a relatively large chip.

THIRD EXAMPLE AND COMPARATIVE EXAMPLE

In a third example, ZnO was formed with a thickness of 100 nm instead of the ITO as the intermediate layer 15 using processes similar to those of the first example. A semiconductor light emitting device 113 according to the third example was diced into 1 mm squares.

As a comparative example, a semiconductor light emitting device 193 (a third comparative example) was manufactured using processes similar to those of the third example except that the first electrode layer 20 including the opening portions was directly formed on the contact layer 523 without the ZnO which is the intermediate layer 15 being formed. The semiconductor light emitting device 193 according to the third comparative example was diced into 1 mm squares.

The characteristics of each of the semiconductor light emitting devices 113 and 193 were compared in the bare chip state.

When comparing the forward voltage value in the case of a current value of 1 A for each of the semiconductor light emitting devices 113 and 193, the forward voltages of the semiconductor light emitting devices 113 and 193 were the same.

Also, when comparing the luminance in the case of a current value of 500 mA for each of the semiconductor light emitting devices 113 and 193, the luminance of the semiconductor light emitting device 113 according to the third example was higher than that of the semiconductor light emitting device 193 according to the third comparative example by a factor of 1.3.

This result illustrates that, even in the case that the intermediate layer 15 is ZnO, a luminance increase similar to that of the case of ITO can be achieved.

FOURTH EXAMPLE AND COMPARATIVE EXAMPLE

In a fourth example, processes similar to those of the first example were used except that $SnO_2$ was formed with a thickness of 40 nm instead of the ITO as the intermediate layer 15. A semiconductor light emitting device 114 according to the fourth example was diced into 1 mm squares.

As a comparative example, a semiconductor light emitting device 194 (a fourth comparative example) was manufactured using processes similar to those of the fourth example except that the first electrode layer 20 including the opening portions was directly formed on the contact layer 523 without the $SnO_2$ which is the intermediate layer 15 being formed. The semiconductor light emitting device 194 according to the fourth comparative example was diced into 1 mm squares.

The characteristics of each of the semiconductor light emitting devices 114 and 194 were compared in the bare chip state.

When comparing the forward voltage value in the case of a current value of 1 A for each of the semiconductor light emitting devices 114 and 194, the forward voltages of the semiconductor light emitting devices 114 and 194 were the same.

When comparing the luminance in the case of a current value of 500 mA for each of the semiconductor light emitting devices 114 and 194, the luminance of the semiconductor light emitting device 114 according to the fourth example was higher than that of the semiconductor light emitting device 194 according to the fourth comparative example by a factor of 1.1.

This result illustrates that the luminance can be increased even in the case that the intermediate layer 15 is $SnO_2$.

FIFTH EXAMPLE AND COMPARATIVE EXAMPLE

In a fifth example, processes similar to those of the first example were used except that the ITO was formed with a thickness of 50 nm as the intermediate layer 15. Subsequently, an i-ray resist (made by Tokyo Ohka Kogyo Co., Ltd., product name: THMR-iP3650) was coated with a thickness of 1 μm instead of the electron beam resist on the metal layer 20A (the Au—ZN layer) formed on the intermediate layer 15. Then, the resist opening portions 202a were made with an opening diameter of 500 nm and a spacing of 1 μm using an i-ray stepper lithography apparatus. The subsequent processes were the same as those of the first example.

A semiconductor light emitting device 115 according to the fifth example was diced into 1 mm squares.

As a comparative example, a semiconductor light emitting device 195 (a fifth comparative example) was manufactured using processes similar to those of the fifth example except that the first electrode layer 20 including the opening portions was directly formed on the contact layer 523 without the ITO which is the intermediate layer 15 being formed. The semiconductor light emitting device 195 according to the fifth comparative example was diced into 1 mm squares.

The characteristics of each of the semiconductor light emitting devices 115 and 195 were compared in the bare chip state When comparing the forward voltage value in the case of a current value of 1 A for each of the semiconductor light emitting devices 115 and 195, the forward voltages of the semiconductor light emitting devices 115 and 195 were the same.

When comparing the luminance in the case of a current value of 500 mA for each of the semiconductor light emitting devices 115 and 195, the luminance of the semiconductor light emitting device 115 according to the fifth example was higher than that of the semiconductor light emitting device 195 according to the fifth comparative example by a factor of 1.3.

This result illustrates that, even in the case that the opening portions 21 of the first electrode layer 20 are made using i-ray stepper lithography, a luminance increase similar to that of the case where electron-beam lithography is used can be achieved.

SIXTH EXAMPLE AND COMPARATIVE EXAMPLE

In a sixth example, processes similar to those of the fifth example were used except that the ITO was formed with a thickness of 100 nm as the intermediate layer 15. Also, the resist opening portions 202a were made with an opening diameter of 1.5 μm and a spacing of 2 μm using an i-ray stepper lithography apparatus.

A semiconductor light emitting device 116 according to the sixth example was diced into 1 mm squares.

As a comparative example, a semiconductor light emitting device 196 (a sixth comparative example) was manufactured using processes similar to those of the sixth example except that the first electrode layer 20 including the opening portions was directly formed on the contact layer 523 without the ITO which is the intermediate layer 15 being formed. The semiconductor light emitting device 196 according to the sixth comparative example was diced into 1 mm squares.

The characteristics of each of the semiconductor light emitting devices 115 and 195 were compared in the bare chip state.

When comparing the forward voltage value in the case of a current value of 1 A for each of the semiconductor light emitting devices 116 and 196, the forward voltages of the semiconductor light emitting devices 116 and 196 were the same.

When comparing the luminance in the case of a current value of 500 mA for each of the semiconductor light emitting devices 116 and 196, the luminance of the semiconductor light emitting device 116 according to the sixth example was higher than that of the semiconductor light emitting device 196 according to the sixth comparative example by a factor of 1.3.

This result illustrates that, even in the case that the opening diameter of the opening portions 21 of the first electrode layer 20 is larger than that of the first example, a luminance increase similar to that of the first example can be achieved.

SEVENTH EXAMPLE AND COMPARATIVE EXAMPLE

In a seventh example, a semiconductor light emitting device 117 was manufactured by the processes illustrated in FIGS. 2A to 2F according to the method using the self-assembly block copolymer of (A) recited above.

First, similarly to the first example, a heterostructure including the n-type InAlP clad layer 512, the InGaP light emitting layer 53, the p-type InAlP clad layer 521, and the like was formed on the n-type GaAs substrate 511. The current diffusion layer 522 including the four elements of p-type InGaAlP was epitaxially grown thereon.

Then, ITO which is the intermediate layer 15 was formed with a thickness of 50 nm as the intermediate layer 15 on the p-type GaP contact layer 523 using sputtering. Subsequently, the metal layer 20A made of, for example, Au (10 nm)/Au—Zn (3%) (40 nm) was formed on the intermediate layer 15 using vapor deposition. The n-side opposing electrode which is the second electrode layer 30 was formed on the back face side of the substrate 511. The light emission wavelength of the semiconductor light emitting device was 635 nm.

Continuing, a resist solution was coated into the metal layer 20A. The resist solution included a resist (THMR-iP3250 of Tokyo Ohka Kogyo Co., Ltd.) diluted to be 1:3 in ethyl lactate (EL). After spin coating the resist solution at 2000 rpm for 30 seconds, heating was performed on a hotplate at 110° C. for 90 seconds to evaporate the solvent. Then, the resist was thermally cured by performing annealing at 250° C. in a nitrogen atmosphere. The film thickness of the resist was 100 nm.

Then, a solution in which an organic SOG composition (OCD-T7 T-5500 (product name) of Tokyo Ohka Kogyo Co., Ltd.) was diluted to be 1:5 in ethyl lactate (EL) was spin coated onto the formed resist at 2000 rpm for 60 seconds. After the spin coating, baking was performed at 110° C. for 60 seconds to completely remove the solvent. Subsequently, curing annealing was performed at 250° C. for 1 hour in a nitrogen atmosphere. The film thickness of the SOG layer 702A was 30 nm.

Continuing, a liquid, in which a block copolymer including a polystyrene (hereinbelow referred to as PS) block having a molecular weight of 160,000 and a polymethylmethacrylate (hereinbelow referred to as PMMA) block having a molecular weight of 45,000 was dissolved in a solvent, was coated at 3000 rpm using spin coating. A block copolymer film having a film thickness of 70 nm was obtained by removing the solvent by pre-baking at 110° C. for 90 seconds. A dot pattern 703 including PMMA with a size of 40 nm and a spacing of 60 nm was formed by annealing the film at 210° C. for 4 hours in a nitrogen atmosphere and by performing phase separation of the PS and the PMMA.

Then, the phase-separated block copolymer film was etched by performing RIE for 10 seconds on the substrate including the phase-separated block copolymer with the conditions of an O₂ flow rate of 30 sccm, a pressure of 13.3 Pa (100 mTorr), and a power of 100 W. At this time, the PMMA was selectively etched due to the etching rate difference between the PS and the PMMA to make a hole pattern of the PS.

Continuing, the SOG was etched for 1 minute using the PS hole pattern as a mask by using an RIE apparatus with a $CF_4$ flow rate of 30 sccm, a pressure of 1.33 Pa (10 mTorr), and a power of 100 W. Thereby, a SOG hole pattern 702 was formed.

Then, the resist hole mask 701 was formed by RIE for 60 seconds using the SOG hole pattern 702 as a mask by using an RIE apparatus with the conditions of an O₂ flow rate of 30 sccm, a pressure of 1.33 Pa (10 mTorr), and a power of 100 W.

Continuing, the metal layer 20A was etched for 100 seconds using an ion milling apparatus with the conditions of an acceleration voltage of 500 V and an ion current of 40 mA. After the etching, the remaining SOG hole pattern 702 and resist hole mask 701 were removed by oxygen ashing. Finally, the pad electrode 202 was formed; and the semiconductor light emitting device 117 was completed.

The semiconductor light emitting device 117 according to the seventh example was diced into 1 mm squares.

As a comparative example, a semiconductor light emitting device 197 (a seventh comparative example) was manufactured using processes similar to those of the seventh example except that the first electrode layer 20 including the opening portions was directly formed on the contact layer 523 without the ITO which is the intermediate layer 15 being formed. The semiconductor light emitting device 197 according to the seventh comparative example was diced into 1 mm squares.

The characteristics of each of the semiconductor light emitting devices 117 and 197 were compared in the bare chip state.

When comparing the forward voltage value in the case of a current value of 1 A for each of the semiconductor light emitting devices 117 and 197, the forward voltages of the semiconductor light emitting devices 117 and 197 were the same.

When comparing the luminance in the case of a current value of 500 mA for each of the semiconductor light emitting devices 117 and 197, the luminance of the semiconductor light emitting device 117 according to the seventh example was higher than that of the semiconductor light emitting device 197 according to the seventh comparative example by a factor of 1.3.

This result illustrates that, even in the case that the opening portions 21 of the first electrode layer 20 are made by using the self-assembly block copolymer, a luminance increase similar to that of the case where electron-beam lithography is used can be achieved.

EIGHTH EXAMPLE AND COMPARATIVE EXAMPLE

In an eighth example, a semiconductor light emitting device 118 was manufactured by the processes illustrated in FIGS. 4A to 4F according to the method utilizing the stamper of (B) recited above.

First, a heterostructure including the n-type InAlP clad layer 512, the InGaP light emitting layer 53, the p-type InAlP clad layer 521, and the like was formed on the n-type GaAs substrate 511. The current diffusion layer 522 including the four elements of p-type InGaAlP was epitaxially grown thereon.

Then, ITO was formed with a thickness of 50 nm as the intermediate layer 15 on the p-type GaP contact layer 523 using sputtering. Subsequently, the metal layer 20A made of, for example, Au (10 nm)/Au—Zn (3%) (40 nm) was formed on the intermediate layer 15 using vapor deposition. An n-side opposing electrode, for example, which is the second electrode layer 30, was formed on the back face side of the substrate 511. The light emission wavelength of the semiconductor light emitting device was 635 nm.

Continuing, a resist solution was coated onto the metal layer 20A. The resist solution was a solution in which a resist (THMR-iP3250 of Tokyo Ohka Kogyo Co., Ltd.) was diluted to be 1:2 in ethyl lactate (EL). The resist solution was spin coated at 2000 rpm for 30 seconds. Subsequently, heating was performed on a hotplate at 110° C. for 90 seconds to evaporate the solvent of the resist solution. The film thickness of the resist 801A was 150 nm.

Then, the quartz stamper 802 including the protruding portions 802a having a size of 200 nm, a spacing of 300 nm, and a height of 150 nm (the configuration of the protruding portions 802a being formed within 9 cm²) was prepared. Then, the side of the stamper 802 having the protruding portions 802a was pressed onto the resist 801A with a pressure of, for example, 10 MPa in a state in which the substrate including the resist was heated to 120° C.

Subsequently, the substrate was cooled to room temperature; and the stamper 802 was released. Thereby, a recessed configuration was made on the resist 801A with a size of 200 nm, a spacing of 300 nm, and a depth of 100 nm.

Then, the resist pattern 801B in which the recessed pattern was made was etched for 30 seconds with the conditions of O₂ of 30 sccm, 10 mTorr, and an RF power of 100 W. After the O₂ RIE, the bottoms of the recessed portions of the resist were removed to expose the Au—Zn film.

Continuing, the metal layer 20A was etched for 90 seconds using an ion milling apparatus with the conditions of an acceleration voltage of 500 V and an ion current of 40 mA to make opening portions. Thereby, the first electrode layer 20 including the opening portions 21 was formed.

After etching the metal layer 20A, oxygen ashing was performed to remove the resist 801. Finally, the pad electrode 202 was formed; and the semiconductor light emitting device 118 was completed.

The semiconductor light emitting device 118 according to the eighth example was diced into 1 mm squares.

As a comparative example, a semiconductor light emitting device 198 (an eighth comparative example) was manufactured using processes similar to those of the eighth example except that the first electrode layer 20 including the opening portions was formed directly on the contact layer 523 without the ITO which is the intermediate layer 15 being formed. The semiconductor light emitting device 198 according to the eighth comparative example was diced into 1 mm squares.

The characteristics of each of the semiconductor light emitting devices 118 and 198 were compared in the bare chip state When comparing the forward voltage value in the case of a current value of 1 A for each of the semiconductor light emitting devices 118 and 198, the forward voltages of the semiconductor light emitting devices 118 and 198 were the same.

When comparing the luminance in the case of a current value of 500 mA for each of the semiconductor light emitting devices 118 and 198, the luminance of the semiconductor light emitting device 118 according to the eighth example was higher than that of the semiconductor light emitting device 198 according to the eighth comparative example by a factor of 1.3.

This result illustrates that, even in the case that the opening portions 21 of the first electrode layer 20 are made by utilizing the stamper, a luminance increase similar to that of the case where electron-beam lithography is used can be achieved.

NINTH EXAMPLE AND COMPARATIVE EXAMPLE

For a ninth example using another method utilizing electron-beam lithography of (C) recited above, a semiconductor light emitting device 121 was manufactured by the processes illustrated in FIGS. 7A to 7E; and a semiconductor light emitting device 291 according to a comparative example was manufactured.

First, a GaN buffer layer 51a and an n-type GaN layer 51b doped with Si were formed as the first semiconductor layer 51 on the growth substrate 10 which is, for example, a sapphire substrate. Then, a MQW layer of, for example, InGaN/GaN which is the light emitting layer 53 was formed. Then, for example, a p-type $Al_{0.2}Ga_{0.8}N$ layer 52a doped with Mg and a p-type GaN layer 52b doped with Mg, which are the second semiconductor layer 52, were epitaxially grown thereon. A contact layer 52c was formed on the p-type GaN layer 52b. The light emission wavelength of the semiconductor light emitting device was 450 nm.

Then, ITO was formed with a thickness of 50 nm as the intermediate layer 15 on the p-type GaN layer 52b using sputtering. Subsequently, the metal layer 20A made of, for example, Au—Zn (3%) (40 nm) was formed on the intermediate layer 15 using vapor deposition.

Continuing, a layer of the electron beam resist 200A was formed with a thickness of 300 nm on the metal layer 20A. Then, a hole pattern (the resist opening portions 202a) was made in the electron beam resist 200A with an opening diameter of 100 nm and a spacing of 200 nm using an electron beam lithography apparatus including a pattern generator and having an acceleration voltage of 50 kV to form the resist pattern 200.

Then, the metal layer 20A was etched for 120 seconds using an ion milling apparatus with the conditions of an acceleration voltage of 500 volts (V) and an ion current of 40 milliamperes (mA) to make opening portions. Thereby, the first electrode layer 20 including the opening portions 21 was formed.

After etching the metal layer 20A, oxygen ashing was performed to remove the resist pattern 200. Then, to obtain an electrical connection with the n-type GaN layer 51b which is the first semiconductor layer 51, patterning was performed to expose the n-type GaN layer 51b. Finally, the pad electrode 202 was formed on the first electrode layer 20; the second electrode layer 30 was formed on the exposed portion of the n-type GaN layer 51b; and the semiconductor light emitting device 121 was completed.

As a comparative example, a semiconductor light emitting device 291 (a ninth comparative example) was manufactured using processes similar to those of the ninth example except that the first electrode layer 20 including the opening portions was directly formed on the p-type GaN layer 52b without the ITO which is the intermediate layer 15 being formed. Specifically, the process of forming the metal layer included forming a metal film made of Ni (2 nm)/Au (40 nm) on the p-type GaN layer 52b using vapor deposition. Subsequently, an ohmic contact was formed using rapid high-temperature annealing. The subsequent processes were performed using methods similar to the processes recited above.

Each of the semiconductor light emitting devices 121 and 291 was diced into 1 mm squares. The characteristics of the semiconductor light emitting devices 121 and 291 were compared in the bare chip state.

When comparing the forward voltage value in the case of a current value of 1 A for each of the semiconductor light emitting devices 121 and 291, the forward voltages of the semiconductor light emitting devices 121 and 291 were the same.

When comparing the luminance in the case of a current value of 500 mA for each of the semiconductor light emitting devices 121 and 291, the luminance of the semiconductor light emitting device 121 according to the ninth example was higher than that of the semiconductor light emitting device 291 according to the ninth comparative example by a factor of 1.2.

This result confirms the effectiveness also for a GaN-based semiconductor light emitting device. Thus, the first semiconductor layer 21, a second semiconductor layer 22, and a light emitting layer 53 can include nitride semiconductors; and the peak wavelength of the light emitted from the light emitting layer 53 can be any wavelength, for example, not less than 370 nm and not more than 700 nm.

TENTH EXAMPLE AND COMPARATIVE EXAMPLE

In a tenth example, a semiconductor light emitting device 122 was manufactured by the processes illustrated in FIGS. 5A to 5G according to another method utilizing the stamper of (B) recited above.

First, the GaN buffer layer 51a and the n-type GaN layer 51b doped with Si were formed as the first semiconductor layer 51 on the growth substrate 10 which is, for example, a sapphire substrate. Then, a MQW layer of, for example, InGaN/GaN which is the light emitting layer 53 was formed. Then, for example, the p-type $Al_{0.2}Ga_{0.8}N$ layer 52a doped with Mg and the p-type GaN layer 52b doped with Mg, which are the second semiconductor layer 52, were epitaxially grown thereon. The contact layer 52c was formed on the p-type GaN layer 52b. The light emission wavelength of the semiconductor light emitting device was 450 nm.

Then, ITO was formed with a thickness of 50 nm as the intermediate layer 15 on the p-type GaN layer 52b using sputtering. Subsequently, the metal layer 20A made of, for example, Au—Zn (3%) (40 nm) was formed on the intermediate layer 15 using vapor deposition.

Continuing, a resist solution was coated onto the metal layer 20A. The resist solution was a solution in which a resist (THMR-iP3250 of Tokyo Ohka Kogyo Co., Ltd.) was diluted to be 1:2 in ethyl lactate (EL). The resist solution was spin coated at 2000 rpm for 30 seconds. Subsequently, heating was performed on a hotplate at 110° C. for 90 seconds to evaporate the solvent of the resist solution. The film thickness of the resist 801A was 150 nm.

Then, the quartz stamper 802 including the protruding portions 802a having a size of 200 nm, a spacing of 300 nm, and a height of 150 nm (the configuration of the protruding portions 802a being formed within 9 cm²) was prepared. Then, the side of the stamper 802 having the protruding portions 802a was pressed onto the resist 801A with a pressure of, for example, 10 MPa in a state in which the substrate including the resist was heated to 120° C.

Subsequently, the substrate was cooled to room temperature; and the stamper 802 was released. Thereby, a recessed configuration was made on the resist 801A with a size of 200 nm, a spacing of 300 nm, and a depth of 100 nm. Then, the resist pattern 801B in which the recessed pattern was made was etched for 30 seconds with the conditions of $O_2$ of 30 sccm, 10 mTorr, and an RF power of 100 W. After the RIE using $O_2$, the bottoms of the recessed portions of the resist were removed to expose the metal layer 20A.

Continuing, the metal layer 20A was etched for 90 seconds using an ion milling apparatus with the conditions of an acceleration voltage of 500 V and an ion current of 40 mA to make opening portions. Thereby, the first electrode layer 20 including the opening portions 21 was formed.

After etching the metal layer 20A, oxygen ashing was performed to remove the resist 801. Then, the n-type GaN layer 51b was exposed by patterning to obtain an electrical connection with the n-type GaN layer 51b which is the first semiconductor layer 51. Finally, the pad electrode 202 was formed on the first electrode layer 20; the second electrode layer 30 was formed on the exposed portion of the n-type GaN layer 51b; and the semiconductor light emitting device 122 was completed.

The semiconductor light emitting device 122 according to the tenth example was diced into 1 mm squares.

As a comparative example, a semiconductor light emitting device 292 (a tenth comparative example) was manufactured using processes similar to those of the tenth example except that the first electrode layer 20 including the opening portions was directly formed on the p-type GaN layer 52b without the ITO which is the intermediate layer 15 being formed. The semiconductor light emitting device 292 according to the tenth comparative example was diced into 1 mm squares.

The characteristics of each of the semiconductor light emitting devices 122 and 292 were compared in the bare chip state.

When comparing the forward voltage value in the case of a current value of 1 A for each of the semiconductor light emitting devices 122 and 292, the forward voltages of the semiconductor light emitting devices 122 and 292 were the same.

When comparing the luminance in the case of a current value of 500 mA for each of the semiconductor light emitting devices 122 and 292, the luminance of the semiconductor light emitting device 122 according to the tenth example was higher than that of the semiconductor light emitting device 292 according to the tenth comparative example by a factor of 1.2.

This result illustrates that, in a GaN-based semiconductor light emitting device, even in the case that the opening portions 21 of the first electrode layer 20 are made by utilizing the stamper, a luminance increase similar to that of the case where electron-beam lithography is used can be achieved.

ELEVENTH EXAMPLE AND COMPARATIVE EXAMPLE

In an eleventh example, a semiconductor light emitting device 123 was manufactured by the processes illustrated in FIGS. 3A to 3G according to another method using the self-assembly block copolymer of (A) recited above.

First, the GaN buffer layer 51a and the n-type GaN layer 51b doped with Si were formed as the first semiconductor layer 51 on the growth substrate 10 which is, for example, a sapphire substrate. Then, a MQW layer of, for example, InGaN/GaN which is the light emitting layer 53 was formed. Then, for example, the p-type $Al_{0.2}Ga_{0.8}N$ layer 52a doped with Mg and the p-type GaN layer 52b doped with Mg, which are the second semiconductor layer 52, were epitaxially grown thereon. The contact layer 52c was formed on the p-type GaN layer 52b. The light emission wavelength of the semiconductor light emitting device was 450 nm.

Then, ITO was formed with a thickness of 50 nm as the intermediate layer 15 on the p-type GaN layer 52b using sputtering. Subsequently, the metal layer 20A made of, for example, Au—Zn (3%) (40 nm) was formed on the intermediate layer 15 using vapor deposition.

Continuing, a resist solution was coated onto the metal layer 20A. The resist solution included a resist (THMR-iP3250 of Tokyo Ohka Kogyo Co., Ltd.) diluted to be 1:3 in ethyl lactate (EL). After spin coating the resist solution at 2000 rpm for 30 seconds, heating was performed on a hotplate at 110° C. for 90 seconds to evaporate the solvent. Then, the resist was thermally cured by annealing at 250° C. in a nitrogen atmosphere. The film thickness of the resist was 100 nm.

Then, a solution in which an organic SOG composition (OCD-T7 T-5500 (product name) of Tokyo Ohka Kogyo Co., Ltd.) was diluted to be 1:5 in ethyl lactate (EL) was spin coated onto the formed resist at 2000 rpm for 60 seconds. After the spin coating, baking was performed at 110° C. for 60 seconds to completely remove the solvent. Subsequently, curing annealing was performed at 250° C. for 1 hour in a nitrogen atmosphere. The film thickness of the SOG layer 702A was 30 nm.

Continuing, a liquid, in which a block copolymer including a polystyrene (hereinbelow referred to as PS) block having a molecular weight of 160,000 and a polymethylmethacrylate (hereinbelow referred to as PMMA) block having a molecular weight of 45,000 was dissolved in a solvent, was coated at 3000 rpm using spin coating. Then, a block copolymer film having a film thickness of 70 nm was obtained by removing the solvent by pre-baking at 110° C. for 90 seconds. The dot pattern 703 including PMMA with a size of 40 nm and a spacing of 60 nm was formed by annealing the film at 210° C. for 4 hours in a nitrogen atmosphere and by performing phase separation of the PS and the PMMA.

Then, the phase-separated block copolymer film was etched by performing RIE for 10 seconds on the substrate including the phase-separated block copolymer with the conditions of an $O_2$ flow rate of 30 sccm, a pressure of 13.3 Pa (100 mTorr), and a power of 100 W. At this time, the PMMA was selectively etched due to the etching rate difference between the PS and the PMMA to make a hole pattern of the PS.

Continuing, the SOG was etched for 1 minute using the PS hole pattern as a mask by using an RIE apparatus with a $CF_4$ flow rate of 30 sccm, a pressure of 1.33 Pa (10 mTorr), and a power of 100 W. Thereby, the SOG hole pattern 702 was formed.

Then, the resist hole mask 701 was formed by performing RIE for 60 seconds using the SOG hole pattern 702 as a mask by using an RIE apparatus with the conditions of an $O_2$ flow rate of 30 sccm, a pressure of 1.33 Pa (10 mTorr), and a power of 100 W.

Continuing, the metal layer 20A was etched for 100 seconds using an ion milling apparatus with the conditions of an acceleration voltage of 500 V and an ion current of 40 mA. After the etching, the remaining SOG hole pattern 702 and resist hole mask 701 were removed by oxygen ashing.

Then, the n-type GaN layer 51b was exposed by patterning to obtain an electrical connection with the n-type GaN layer 51b which is the first semiconductor layer 51. Finally, the pad electrode 202 was formed on the first electrode layer 20; the second electrode layer 30 was formed on the exposed portion of the n-type GaN layer 51b; and the semiconductor light emitting device 123 was completed.

As a comparative example, a semiconductor light emitting device 293 (an eleventh comparative example) was manufactured using processes similar to those of the eleventh example except that the first electrode layer 20 including the opening portions was directly formed on the p-type GaN layer 52b without the ITO which is the intermediate layer 15 being formed. Specifically, the process of forming the metal layer included forming a metal film made of Ni (1 nm)/Ag (40 nm) on the p-type GaN layer 52b using vapor deposition. Subsequently, an ohmic contact was formed using rapid high-temperature annealing. The subsequent processes were performed using methods similar to the processes recited above.

Each of the semiconductor light emitting devices 123 and 293 was diced into 1 mm squares. The characteristics of the semiconductor light emitting devices 123 and 293 were compared in the bare chip state.

When comparing the forward voltage value in the case of a current value of 1 A for each of the semiconductor light emitting devices 123 and 293, the forward voltages of the semiconductor light emitting devices 123 and 293 were the same.

When comparing the luminance in the case of a current value of 500 mA for each of the semiconductor light emitting devices 123 and 293, the luminance of the semiconductor light emitting device 123 according to the eleventh example was higher than that of the semiconductor light emitting device 293 according to the eleventh comparative example by a factor of 1.15.

This result illustrates that, in a GaN-based semiconductor light emitting device, the luminance can be increased even in the case that the opening portions 21 of the first electrode layer 20 are made by using the self-assembly block copolymer.

TWELFTH EXAMPLE AND COMPARATIVE EXAMPLE

In a twelfth example, ZnO was formed with a thickness of 100 nm instead of the ITO as the intermediate layer 15 using processes similar to those of the tenth example. The metal layer 20A made of Ag—Cu (5%) was formed with a thickness of 40 nm instead of the Au—Zn layer on the intermediate layer 15 using vapor deposition. The etching of the Ag—Cu was performed for 100 seconds using an ion milling apparatus with the conditions of an acceleration voltage of 500 V and an ion current of 40 mA. The other processes were similar to those of the tenth example.

A semiconductor light emitting device 124 according to the twelfth example was diced into 1 mm squares.

As a comparative example, a semiconductor light emitting device 294 (a twelfth comparative example) was manufactured using processes similar to those of the twelfth example except that the first electrode layer 20 including the opening portions was directly formed on the p-type GaN layer 52b without the ZnO which is the intermediate layer 15 being formed. The semiconductor light emitting device 294 according to the twelfth comparative example was diced into 1 mm squares.

The characteristics of each of the semiconductor light emitting devices 124 and 294 were compared in the bare chip state.

When comparing the forward voltage value in the case of a current value of 1 A for each of the semiconductor light emitting devices 124 and 294, the forward voltages of the semiconductor light emitting devices 124 and 294 were the same.

When comparing the luminance in the case of a current value of 500 mA for each of the semiconductor light emitting devices 124 and 294, the luminance of the semiconductor light emitting device 124 according to the twelfth example was higher than that of the semiconductor light emitting device 294 according to the twelfth comparative example by a factor of 1.15.

This result illustrates that, in a GaN-based semiconductor light emitting device, the luminance can be increased even in the case that ZnO is used as the intermediate layer 15.

Although exemplary embodiments are described above, the invention is not limited to these examples. For example, although the first conductivity type is described as the n-type and the second conductivity type is described as the p-type, the invention is practicable even in the case that the first conductivity type is the p-type and the second conductivity type is the n-type.

As described above, according to a semiconductor light emitting device and a method for manufacturing the same according to the embodiments, it is possible to increase the emission efficiency of the light produced by the light emitting layer 53 to the outside.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor light emitting device, comprising:
a structural body including a first semiconductor layer of a first conductivity type, a second semiconductor layer of a second conductivity type, and a light emitting layer provided between the first semiconductor layer and the second semiconductor layer;
a first electrode layer provided on a side of the second semiconductor layer opposite to the first semiconductor layer, the first electrode layer including a metal portion and a plurality of opening portions piercing the metal portion along a direction from the first semiconductor layer toward the second semiconductor layer, an equivalent circular diameter of each of the opening portions being not less than 10 nanometers and not more than 5 micrometers;
an intermediate layer provided between the second semiconductor layer and the first electrode layer in ohmic contact with the second semiconductor layer; and
a second electrode layer electrically connected to the first semiconductor layer;
wherein the equivalent circular diameter of the opening portion is not more than about ½ of the center wavelength of a light emitted from the light emitting layer.

2. The device according to claim 1, wherein the intermediate layer is a metal oxide film.

3. The device according to claim 2, wherein the metal oxide film includes at least one selected from ITO, $SnO_2$, ZnO, CdO, $TiO_2$, NiO, $Ga_2O_3$, InGaZnO, $CuAlO_2$, $CuGaO_2$, $CuInO_2$, LaCuOS, LaCuOSe, and $SrCu_2O_2$.

4. The device according to claim 1, wherein the intermediate layer is transmissive to light emitted from the light emitting layer.

5. The device according to claim 4, wherein the intermediate layer includes a transmission with respect to the light of not less than 90 percent.

6. The device according to claim 1, wherein the intermediate layer has a hole communicating with the opening portions.

7. The device according to claim 1, wherein the first electrode layer includes at least one selected from Ag, Au, Al, Zn, Zr, Si, Ge, Pt, Rh, Ni, Pd, Cu, Sn, C, Mg, Cr, Te, Se, and Ti.

8. The device according to claim 1, wherein a thickness of the first electrode layer is not less than 10 nanometers and not more than 50 nanometers.

9. The device according to claim 1, wherein a surface area of the first electrode layer as viewed along the direction is not less than 1 square millimeter.

10. The device according to claim 1, wherein a sheet resistance of the first electrode layer is not more than 10 ohms/□.

11. The device according to claim 1, wherein a carrier concentration of the second semiconductor layer is not less than $1 \times 10^{19}$/cubic centimeter.

12. The device according to claim 1, wherein the second semiconductor layer includes a current diffusion layer.

13. The device according to claim 12, wherein the second semiconductor layer includes a contact layer provided between the current diffusion layer and the intermediate layer.

14. The device according to claim 13, wherein the current diffusion layer contains multiple elements.

15. The device according to claim 1, wherein the thickness of the intermediate layer is not less than 10 nm and not more than 200 nm.

16. The device according to claim 1, further comprising a pad electrode provided on the first electrode layer, wherein the metal portion of the first electrode layer is continuous without a break between any two points from the pad electrode.

17. The device according to claim 1, wherein the second semiconductor layer includes a clad layer, a contact layer provided between the clad layer and the intermediate layer, and a current diffusion layer provided between the clad layer and the contact layer.

* * * * *